(12) United States Patent
Harada et al.

(10) Patent No.: US 8,361,703 B2
(45) Date of Patent: *Jan. 29, 2013

(54) RESIST PROTECTIVE COATING COMPOSITION AND PATTERNING PROCESS

(75) Inventors: Yuji Harada, Joetsu (JP); Jun Hatakeyama, Joetsu (JP); Koji Hasegawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 369 days.

This patent is subject to a terminal disclaimer.

(21) Appl. No.: 12/628,705

(22) Filed: Dec. 1, 2009

(65) Prior Publication Data

US 2010/0136486 A1 Jun. 3, 2010

(30) Foreign Application Priority Data

Dec. 2, 2008 (JP) ................................. 2008-307188

(51) Int. Cl.
*G03F 7/11* (2006.01)
*G03F 7/20* (2006.01)
*G03F 7/30* (2006.01)

(52) U.S. Cl. ........ 430/311; 430/325; 430/326; 430/330; 430/942; 430/910; 430/907; 430/273.1

(58) Field of Classification Search ........................ None
See application file for complete search history.

(56) References Cited

U.S. PATENT DOCUMENTS

| | | | |
|---|---|---|---|
| 5,541,037 A | 7/1996 | Hatakeyama et al. | |
| 6,312,867 B1 | 11/2001 | Kinsho et al. | |
| 6,869,744 B2 | 3/2005 | Hatakeyama | |
| 7,244,545 B2 | 7/2007 | Takebe et al. | |
| 7,455,952 B2 | 11/2008 | Hatakeyama et al. | |
| 7,537,880 B2 | 5/2009 | Harada et al. | |
| 2007/0179309 A1 | 8/2007 | Hasegawa et al. | |
| 2008/0032202 A1 | 2/2008 | Ishizuka et al. | |
| 2008/0096131 A1* | 4/2008 | Hatakeyama et al. | 430/281.1 |
| 2009/0142715 A1 | 6/2009 | Araki et al. | |
| 2010/0112482 A1* | 5/2010 | Watanabe et al. | 430/286.1 |
| 2011/0151378 A1* | 6/2011 | Matsumura et al. | 430/270.1 |

FOREIGN PATENT DOCUMENTS

| | | |
|---|---|---|
| JP | 60-38821 A | 2/1985 |
| JP | 62-62520 A | 3/1987 |
| JP | 62-62521 A | 3/1987 |
| JP | 6-273926 | 9/1994 |
| JP | 2803549 B2 | 7/1998 |
| JP | 2000-336121 A | 12/2000 |
| JP | 2002-99090 A | 4/2002 |
| JP | 2005-264131 A | 9/2005 |
| JP | 2006-91798 A | 4/2006 |
| JP | 2006-133716 A | 5/2006 |
| JP | 2007-204385 A | 8/2007 |
| JP | 2008-111103 A | 5/2008 |
| WO | WO 2005/042453 A1 | 5/2005 |
| WO | WO 2005/069676 A1 | 7/2005 |
| WO | WO2009/142181 A1 * | 11/2009 |

OTHER PUBLICATIONS

Allen et al., "Design of Protective Topcoats for Immersion Lithography", Journal of Photopolymer Science and Technology, vol. 18, No. 5, 2005, pp. 615-619.
B.J. Lin., "Semiconductor Foundry, Lithography, and Partners", Micropatterning Division, Proceedings of SPIE, vol. 4690, xxix, 2002.
Maruse et al., "Characterization of molecular interfaces in hydrophobic systems", Progress in Organic Coatings, vol. 31, 1997, pp. 97-104.
Maruse et al., "Neuer Begriff und ein Nano-Hybrid System fur Hydrophobie", XXIV FATIPEC Congress Book, vol. 1 B, p. B15-616, 1997.
Owa et al., "Immersion lithography; its potential performance amd issues", Proceedings of SPIE, vol. 5040, 2003, p. 724.
Sanders et al., "New materials for surface energy control of 193 nm photoresists", 4th Immersion symposium RE-04, 2006, pp. 1-23.
Shirota et al., "Developement of non-topcoat resist polymers for 193-nm immersion lithography", Preoceedings of SPIE, vol. 6519, p. 651905-1-651905-11, (2007).
Taku Hirayama., "Resist and Cover Material Investigation for Immersion Lithography", 2nd Immersion Workshop, Jul. 11, 2003.

* cited by examiner

*Primary Examiner* — Sin J. Lee
(74) *Attorney, Agent, or Firm* — Birch, Stewart, Kolasch & Birch, LLP

(57) ABSTRACT

A protective coating composition comprising a polymer of acyl-protected hexafluoroalcohol structure as a base polymer, optionally in admixture with a second polymer containing sulfonic acid amine salt in recurring units is applied onto a resist film. The protective coating is transparent to radiation of wavelength up to 200 nm.

19 Claims, No Drawings

RESIST PROTECTIVE COATING COMPOSITION AND PATTERNING PROCESS

CROSS-REFERENCE TO RELATED APPLICATION

This non-provisional application claims priority under 35 U.S.C. §119(a) on Patent Application No. 2008-307188 filed in Japan on Dec. 2, 2008, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a resist-coated substrate, with a liquid (e.g., water) intervening between the lens and the substrate. More particularly, it relates to a resist protective coating composition used to form a protective coating on a resist film for protection, and a process for forming a pattern using the same.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF laser (248 nm) enabled mass-scale production of dynamic random access memories (DRAM) with an integration degree of 64 MB (processing feature size$\leq$0.25 µm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA$\leq$0.9), is considered to comply with 65-nm node devices. For the fabrication of next 45-nm node devices, the $F_2$ laser lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems arise when a resist film is exposed in the presence of water. For example, the acid once generated from a photoacid generator and a basic compound added to the resist can be partially leached in water. As a result, pattern profile changes and pattern collapse can occur. It is also pointed out that water droplets remaining on the resist film, though in a minute volume, can penetrate into the resist film to generate defects.

These drawbacks of the ArF immersion lithography may be overcome by providing a protective coating between the resist film and water to prevent resist components from being leached out and water from penetrating into the resist film (see the 2nd Immersion Workshop, Resist and Cover Material Investigation for Immersion Lithography, 2003).

With respect to the protective coating on the photoresist film, a typical antireflective coating on resist (ARCOR) process is disclosed in JP-A 62-62520, JP-A 62-62521, and JP-A 60-38821. The ARCs are made of fluorinated compounds having a low refractive index, such as perfluoroalkyl polyethers and perfluoroalkyl amines. Since these fluorinated compounds are less compatible with organic substances, fluorocarbon solvents are used in coating and stripping of protective coatings, raising environmental and cost issues.

Other resist protective coating materials under investigation include water-soluble or alkali-soluble materials. See, for example, JP-A 6-273926, Japanese Patent No. 2,803,549, and J. Photopolymer Sci. and Technol., Vol. 18, No. 5, p 615, 2005. Since the alkali-soluble resist protective coating material is strippable with an alkaline developer, it eliminates a need for an extra stripping unit and offers a great cost saving. From this standpoint, great efforts have been devoted to develop water-insoluble resist protective coating materials, for example, resins having alkali-soluble groups such as fluorinated alcohol, carboxyl or sulfo groups on side chains. See WO 2005/42453, WO 2005/69676, JP-A 2005-264131, JP-A 2006-133716, and JP-A 2006-91798.

Required of the resist protective coating materials are not only the ability to prevent the generated acid and basic compound in the photoresist film from being leached out in water and to prevent water from penetrating into the resist film, but also such properties as water repellency and water slip. Of these properties, water repellency is improved by introducing fluorine into the resin and water slip is improved by combining water repellent groups of different species to form a micro-domain structure, as reported, for example, in XXIV FATIPEC Congress Book, Vol. B, p 15 (1997) and Progress in Organic Coatings, 31, p 97 (1997).

One exemplary polymer exhibiting high water slip and water repellency is a fluorinated ring-closing polymerization polymer having hexafluoroalcohol pendants. It is reported in Proc. SPIE, Vol. 6519, p 651905 (2007) that this polymer is further improved in water slip by protecting hydroxyl groups on its side chains with acid labile groups.

Although the introduction of fluorine into resins is effective not only for improving water repellency, but also for improving water slip properties as demonstrated by sliding angle, receding contact angle or the like, excessive introduction of fluorine results in resins with a greater surface contact angle following alkaline development. In the current technology, those defects so called "blob defects" that occur on the resist film surface (especially in the unexposed area) after development are regarded problematic. A tendency is known that a resist film having higher water repellency suffers from more blob defects. Accordingly, introducing extra fluorine into resins for the purpose of enhancing water repellency and water slip increases a likelihood of blob defects occurring.

It is believed that blob defects are caused by water droplets remaining on the resist film surface after development. The internal energy of a water droplet on a resist film increases in the spin drying step and reaches the maximum when the water droplet leaves the resist film surface. At the same time as the water droplet leaves the resist film surface, the resist film surface is damaged by that energy, which is observable as blob defects.

The internal energy of a water droplet on a resist film is higher as the surface becomes more water repellent. When a protective coating with higher water repellency is disposed on a resist film, the resist surface has a greater contact angle due to intermixing between the resist film and the protective coating, increasing a likelihood of blob defects occurring. This indicates that for the purpose of suppressing the occurrence of blob defects, the surface contact angle after development must be reduced in order to reduce the internal energy of a water droplet.

Application of a more hydrophilic resist protective coating may be effective for reducing the surface contact angle after development. However, such a protective coating provides a smaller receding contact angle, which interferes with high-speed scanning and allows water droplets to remain after scanning, giving rise to defects known as water marks. A resist protective coating having carboxyl or sulfo groups is proposed in U.S. Pat. No. 7,455,952 (JP-A 2006-91798). Since both carboxyl and sulfo groups are highly hydrophilic, water repellency and water slip worsen.

It is then proposed to form a protective coating from a blend of a first polymer having sulfo groups and a second polymer having highly water repellent hexafluoroalcohol groups such that the second polymer having hexafluoroalcohol groups is segregated at the surface of the protective coating and the first polymer having sulfa groups is segregated at the interface with the underlying resist. See 4th Immersion Symposium RE-04 New Materials for surface energy control of 193 nm photoresists, Dan Sander et al. Although this protective coating is effective in reducing blob defects, the resist pattern suffers from film slimming after development because sulfo groups bind with an amine component in the resist so that the amine component becomes depleted near the resist surface. There exists a desire for a protective coating which prevents film slimming in order to produce a rectangular profile pattern and renders more hydrophilic the resist surface after development in order to inhibit blob defects.

The resist protective coating materials discussed above are needed not only in the ArF immersion lithography, but also in the electron beam (EB) lithography. When EB lithography is performed for mask image writing, it is pointed out that the resist changes its sensitivity due to evaporation of the acid generated during image writing, evaporation of vinyl ether produced by deprotection of acetal protective groups, or the like, as discussed in JP-A 2002-99090. It is then proposed to suppress resist sensitivity variation by applying a protective coating material to form a barrier film on top of a resist film.

CITATION LIST

Patent Document 1: JP-A S62-62520
Patent Document 2: JP-A S62-62521
Patent Document 3: JP-A S60-38821
Patent Document 4: JP-A H06-273926
Patent Document 5: JP 2803549
Patent Document 6: WO 2005/42453
Patent Document 7: WO 2005/69676
Patent Document 8: JP-A 2005-264131
Patent Document 9: JP-A 2006-133716
Patent Document 10: U.S. Pat. No. 7,455,952 (JP-A 2006-91798)
Patent Document 11: JP-A 2002-99090
Non-Patent Document 1: Proc. SPIE, Vol. 4690, xxix, 2002
Non-Patent Document 2: Proc. SPIE, Vol. 5040, p 724, 2003
Non-Patent Document 3: 2nd Immersion Workshop, Resist and Cover Material Investigation for Immersion Lithography (2003)
Non-Patent Document 4: J. Photopolymer Sci. and Technol., Vol. 18, No. 5, p 615, 2005
Non-Patent Document 5: XXIV FATIPEC Congress Book, Vol. B, p 15 (1997)
Non-Patent Document 6: Progress in Organic Coatings, 31, p 97 (1997)
Non-Patent Document 7: Proc. SPIE, Vol. 6519, p 651905 (2007)
Non-Patent Document 8: 4th Immersion Symposium RE-04 New Materials for surface energy control of 193 nm photoresists, Dan Sander et al.

SUMMARY OF INVENTION

An object of the invention is to provide a resist protective coating composition adapted for use in the immersion lithography which has improved water repellency and water slip, causes few development defects, and allows for formation of a resist pattern of satisfactory profile after development; and a pattern forming process using the protective coating composition.

The inventors have found that a polymer of acyl-protected fluoroalcohol structure, as represented by formula (1) below, has sufficient water repellency and water slip for use as a base polymer in resist protective coating material. The polymer is highly transparent to radiation of wavelength up to 200 nm. Properties of the polymer including water repellency, water slip, fat solubility, acid lability, and hydrolysis can be tailored by a choice of the structure. The polymer can be prepared from reactants which are readily available and easy to handle. When a protective coating composition comprising the polymer optionally in blend with a second polymer containing sulfonic acid amine salt in recurring units is applied onto a resist film, the resulting protective coating is effective in minimizing development defects and forming a resist pattern of improved profile.

Accordingly, the present invention provides a resist protective coating composition and a pattern forming process, as defined below.

In one aspect, the invention provides a resist protective coating composition comprising a polymer P1 comprising recurring units of the general formula (1).

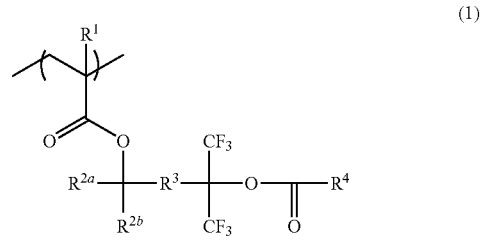

Herein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^3$ is a single bond or straight, branched or cyclic $C_1$-$C_{15}$ alkylene, and $R^4$ is a straight, branched or cyclic $C_1$-$C_{20}$ alkyl or fluoroalkyl which may contain —O— or —C(=O)—.

In a preferred embodiment, the polymer P1 further comprises recurring units of at least one type selected from the general formulae (2a) to (2f).

(2a) 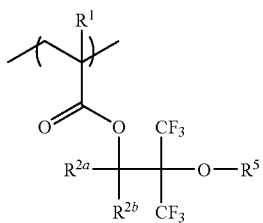

(2b) 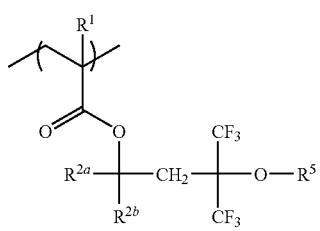

(2c) 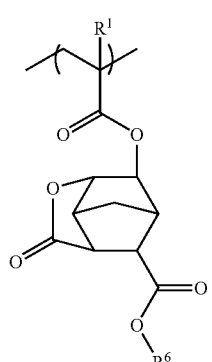

(2d) 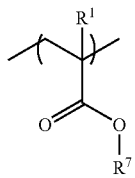

(2e) 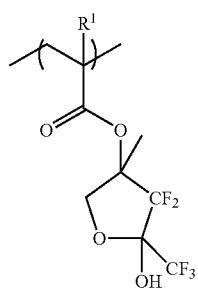

(2f) 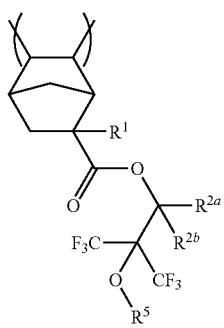

Herein $R^1$, $R^{2a}$ and $R^{2b}$ are as defined above, $R^5$ is hydrogen, a straight, branched or cyclic $C_1$-$C_{15}$ alkyl or fluoroalkyl, or an acid labile group, $R^6$ is a straight, branched or cyclic $C_1$-$C_{15}$ fluoroalkyl, and $R^7$ is an acid labile group.

In one embodiment, the protective coating composition may further comprise a polymer P2 comprising recurring units of the general formula (3) or (4).

(P2)

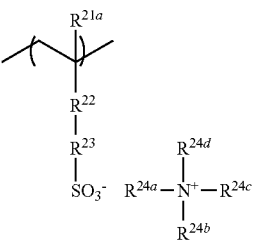 (3)

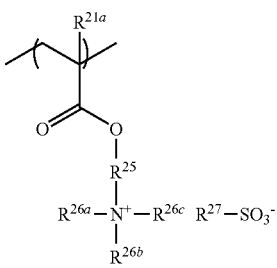 (4)

Herein $R^{21a}$ and $R^{21b}$ are hydrogen or methyl, $R^{22}$ is a single bond, $C_1$-$C_4$ alkylene, phenylene, —C(=O)—, or —C(=O)—NH—, $R^{23}$ is a single bond or straight, branched or cyclic $C_1$-$C_8$ alkylene, $R^{24a}$ to $R^{24d}$ and $R^{26a}$ and $R^{26c}$ are each independently selected from the group consisting of hydrogen, straight, branched or cyclic $C_1$-$C_{12}$ alkyl, alkenyl, oxoalkyl and oxoalkenyl, $C_6$-$C_{20}$ aryl, $C_7$-$C_{12}$ aralkyl and aryloxoalkyl, in which some or all hydrogen atoms may be substituted by alkoxy groups, $R^{24a}$ to $R^{24d}$ and $R^{26a}$ to $R^{26c}$ may contain a nitrogen atom, ether, ester, hydroxyl or carboxyl group, any two of $R^{24a}$ to $R^{24d}$ and any two of $R^{26a}$ to $R^{26c}$ may bond together to form a ring with the nitrogen atom to which they are attached, in this event, each participant in the ring formation independently denotes a $C_3$-$C_{15}$ alkylene or a hetero-aromatic ring containing the nitrogen atom therein, $R^{25}$ is straight, branched or cyclic $C_1$-$C_8$ alkylene, and $R^{27}$ is a straight, branched or cyclic $C_1$-$C_{20}$ alkyl which may have a carbonyl, ester, ether group or halogen atom, or a $C_6$-$C_{15}$ aryl which may have a carbonyl, ester, ether, halogen atom, or $C_1$-$C_{15}$ alkyl or fluoroalkyl.

In a preferred embodiment, the polymer P2 further comprises recurring units of the general formula (5).

(5)

Herein $R^{21c}$ is hydrogen or methyl, $R^{28a}$ and $R^{28b}$ are hydrogen or straight, branched or cyclic $C_1$-$C_{15}$ alkyl, $R^{28a}$ and $R^{28b}$ may bond together to form a ring with the carbon atom to which they are attached.

In one preferred embodiment, the protective coating composition further comprises a solvent. Typically the solvent comprises an ether compound of 8 to 12 carbon atoms. Preferably the solvent comprises at least one ether compound of 8 to 12 carbon atoms selected from the group consisting of di-n-butyl ether, diisobutyl ether, di-sec-butyl ether, di-n-pentyl ether, diisopentyl ether, di-sec-pentyl ether, di-t-amyl ether, and di-n-hexyl ether. More preferably, the solvent comprises a mixture of the ether compound and 0.1 to 90% by weight of a higher alcohol of 4 to 10 carbon atoms.

In another aspect, the invention provides a pattern forming process comprising the steps of (1) applying a resist material onto a substrate to form a photoresist film, (2) applying the resist protective coating composition defined above onto the photoresist film to form a protective coating thereon, (3) heat treating and exposing the coated substrate to high-energy radiation from a projection lens through a photomask while holding a liquid between the substrate and the projection lens, and (4) developing with a developer.

Preferably the liquid is water. Most often the high-energy radiation has a wavelength in the range of 180 to 250 nm. Also preferably, the developing step uses a liquid alkaline developer for thereby developing the photoresist film to form a resist pattern and stripping the resist protective coating therefrom at the same time.

In a further aspect, the invention provides a lithography process for forming a pattern, comprising the steps of forming a protective coating on a photoresist layer disposed on a mask blank, exposing the layer structure in vacuum to electron beam, and developing, wherein the protective coating is formed of the protective coating composition defined above.

ADVANTAGEOUS EFFECTS OF INVENTION

A polymer of acyl-protected fluoroalcohol structure is useful as resist protective coating material. The polymer is highly transparent to radiation of wavelength up to 200 nm. Properties of the polymer including water repellency, water slip, fat solubility, acid lability, and hydrolysis susceptibility can be tailored by a choice of the polymer structure. The polymer can be prepared from reactants which are readily available and easy to handle. The resist protective coating composition has a large receding contact angle enough to inhibit leaching-out of resist components and penetration of water into a resist film, when processed by the immersion lithography. It also ensures that the resist film is developed into a satisfactorily profiled pattern with minimal development defects.

DESCRIPTION OF EMBODIMENTS

The singular forms "a", "an" and "the" include plural referents unless the context clearly dictates otherwise.

The notation (Cn-Cm) means a group containing from n to m carbon atoms per group.

Polymer

The polymer P1 used in the resist protective coating composition of the invention is characterized by comprising recurring units of the general formula (1).

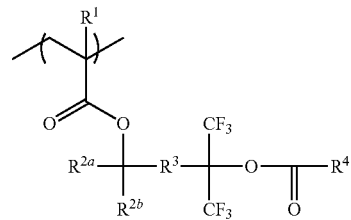

Herein $R^1$ is hydrogen, methyl or trifluoromethyl. $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached. $R^3$ is a single bond or straight, branched or cyclic $C_1$-$C_{15}$ alkylene. $R^4$ is a straight, branched or cyclic $C_1$-$C_{20}$ alkyl or fluoroalkyl which may contain —O— or —C(=O)—.

In formula (1), examples of straight, branched or cyclic $C_1$-$C_{15}$ alkyl groups represented by $R^{2a}$ and $R^{2b}$, and straight, branched or cyclic $C_1$-$C_{20}$, preferably $C_1$-$C_{15}$, alkyl groups represented by $R^4$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^{2a}$ and $R^{2b}$ may bond together to form a non-aromatic ring with the carbon atom to which they are attached. In this event, each of $R^{2a}$ and $R^{2b}$ is alkylene, examples of which include the above-exemplified alkyl groups with one hydrogen atom eliminated, and exemplary rings include cyclopentyl and cyclohexyl.

Suitable straight, branched or cyclic $C_1$-$C_{15}$ alkylene groups represented by $R^3$ include the above-exemplified alkyl groups with one hydrogen atom eliminated.

Suitable straight, branched or cyclic $C_1$-$C_{20}$, preferably $C_1$-$C_{15}$, fluoroalkyl groups represented by $R^4$ include the above-exemplified alkyl groups in which some or all hydrogen atoms are substituted by fluorine atoms. Examples include trifluoromethyl, 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

Examples of the recurring units having formula (1) are given below, but not limited thereto.

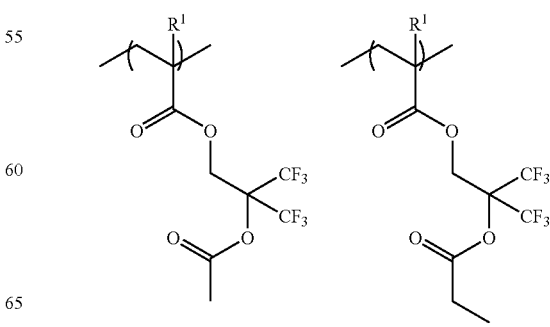

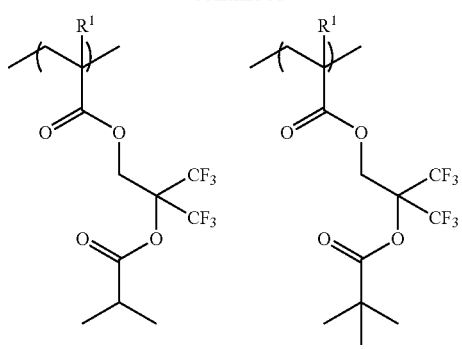
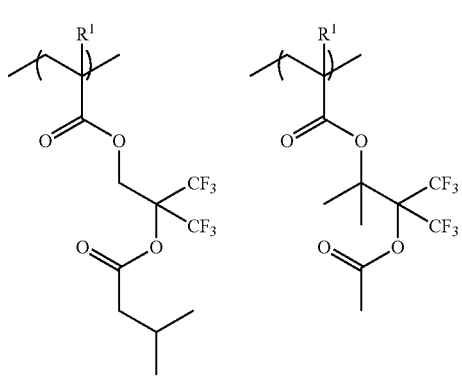
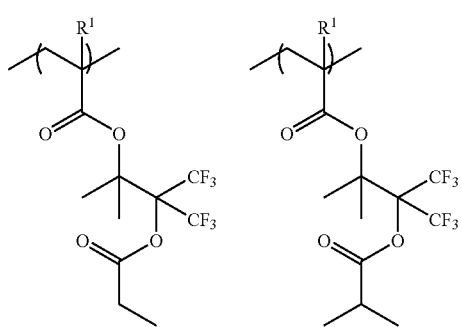
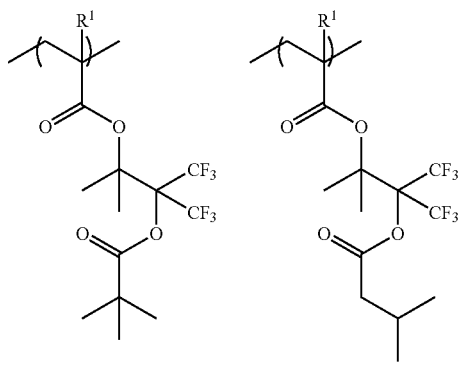
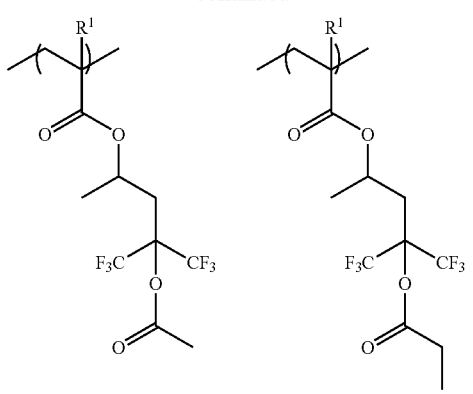
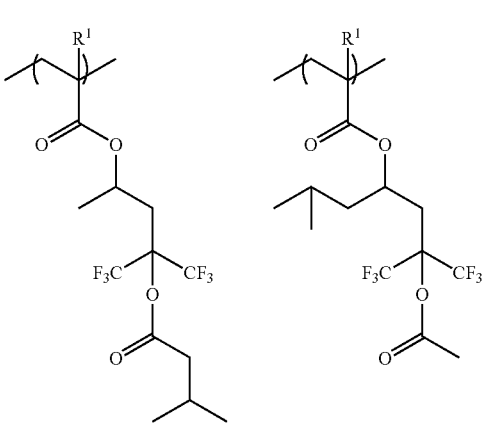
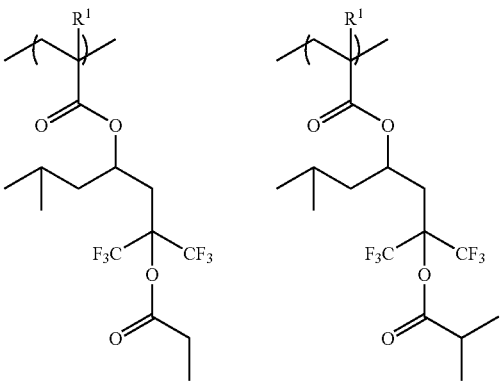

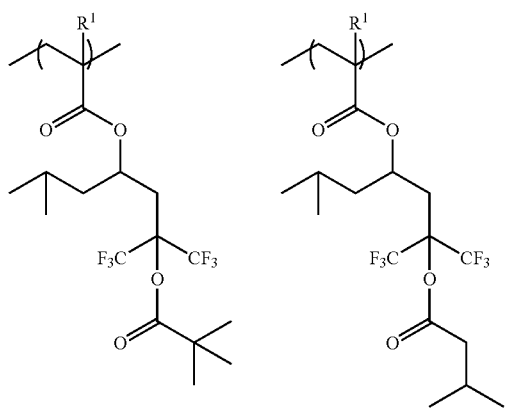
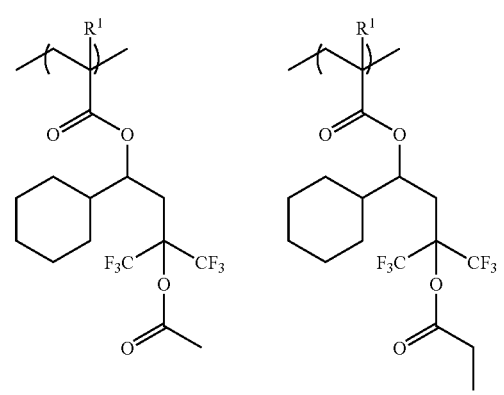
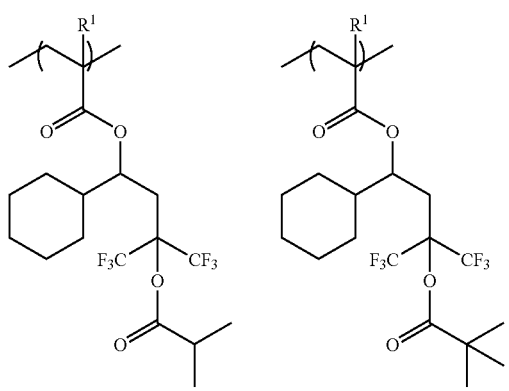
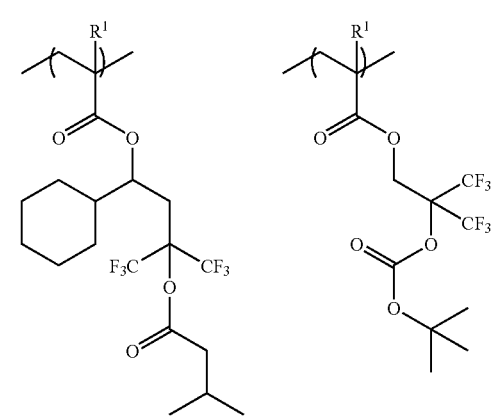
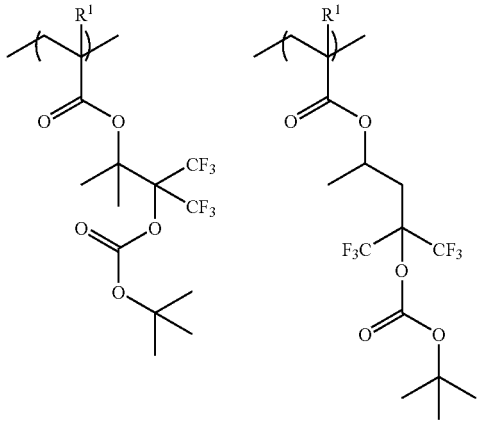
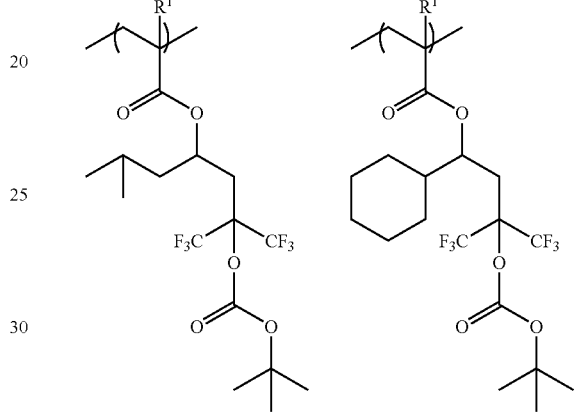

Herein R¹ is as defined above.

In the polymer for use in the resist protective coating composition, the recurring units of formula (1) contribute to improvements in water repellent and water slip properties. The polymer comprising recurring units of formula (1) is easy to control its structural factors, specifically the length of carbon chain, the degree of branching, and the number of fluorine atoms of $R^4$. Thus a polymer having water repellent and water slip properties necessary as a particular protective coating material can be prepared.

If desired, the polymer may be endowed with alkaline hydrolysis susceptibility. In general, the hydroxyl group of fluoroalcohol has a higher acidity than the hydroxyl group of common alcohols. The ester bond in formula (1) is an ester of the hydroxyl group of fluoroalcohol having an even higher acidity due to the bonding of six fluorine atoms to adjacent carbons with a carboxylic acid, that is, a so-called mixed acid anhydride. Thus the ester bond in formula (1) is significantly susceptible to alkaline hydrolysis, as compared with the esters of common alcohols with carboxylic acids. Specifically, it is readily hydrolyzable with an alkaline developer or the like.

Hydrolysis of the ester bond in formula (1) results in a fluoroalcohol structure which is highly hydrophilic and highly alkaline soluble, which provides a reduction of the contact angle at polymer surface, especially after development, and contributes to a reduction of blob defects.

In addition to the recurring units of formula (1), the polymer may further comprise recurring units of one or multiple types selected from the general formulae (2a) to (2f). The polymer having additional recurring units incorporated herein is more improved in water repellency, water slip, alkaline solubility and contact angle after development.

(2a) 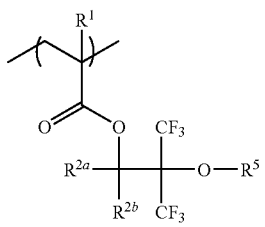

(2b) 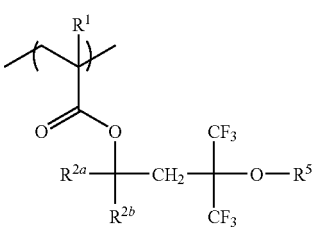

(2c) 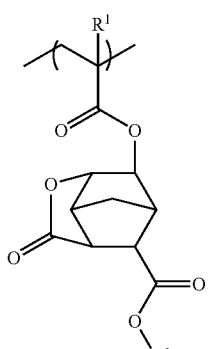

(2d) 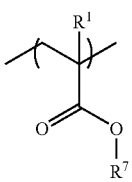

(2e) 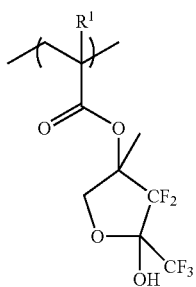

(2f) 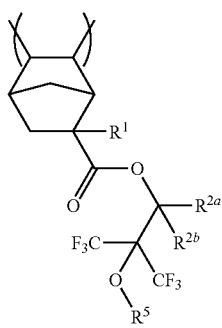

Herein $R^1$ is hydrogen, methyl or trifluoromethyl. $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached. $R^5$ is hydrogen, a straight, branched or cyclic $C_1$-$C_{15}$ alkyl or fluoroalkyl, or an acid labile group. $R^6$ is a straight, branched or cyclic $C_1$-$C_{15}$ fluoroalkyl. $R^7$ is an acid labile group.

The straight, branched or cyclic $C_1$-$C_{15}$ alkyl groups represented by $R^{2a}$ and $R^{2b}$ and the rings formed thereby are the same as previous; and the straight, branched or cyclic $C_1$-$C_{15}$ alkyl groups represented by $R^5$ are also the same as previous. The straight, branched or cyclic $C_1$-$C_{15}$ fluoroalkyl groups represented by $R^5$ and $R^6$ are the same as previously described for $R^4$ in formula (1).

The acid labile groups represented by $R^5$ and $R^7$ in formulae (2a) to (2f) may be selected from a variety of such groups. Specifically exemplary acid labile groups include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

(L1) 

(L2) 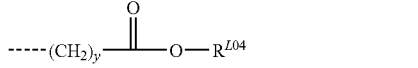

(L3) 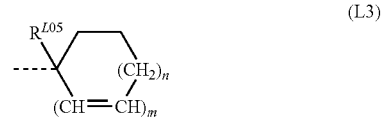

(L4) 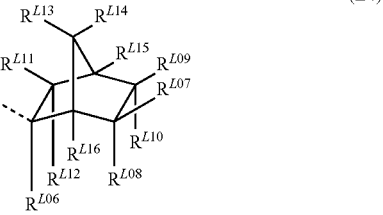

Herein $R^{L01}$, and $R^{L02}$ are hydrogen or straight, branched or cyclic alkyl groups of 1 to 18 carbon atoms, preferably 1 to 10 carbon atoms. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). $R^{L05}$ is an optionally substituted, straight, branched or cyclic $C_1$-$C_{10}$ alkyl group or an optionally substituted $C_6$-$C_{20}$ aryl group. $R^{L06}$ is an optionally substituted, straight, branched or cyclic $C_1$-$C_{10}$ alkyl group or an optionally substituted $C_6$-$C_{20}$ aryl group. $R^{L07}$ to $R^{L16}$ independently represent hydrogen or optionally substituted monovalent hydrocarbon groups of 1 to 15 carbon atoms. Letter y is an integer of 0 to 6, m is equal to 0 or 1, n is equal to 0, 1, 2 or 3, and 2m+n is equal to 2 or 3. The broken line denotes a valence bond.

In formula (L1), exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

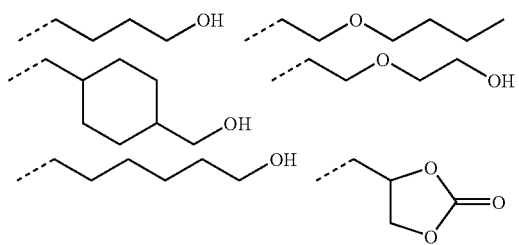

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), exemplary tertiary alkyl groups of $R^{L04}$ are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

In formula (L3), examples of the optionally substituted alkyl groups of $R^{L05}$ include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted $C_6$-$C_{20}$ aryl groups include phenyl, methylphenyl, naphthyl, anthryl, phenanthryl, and pyrenyl.

In formula (L4), examples of optionally substituted, straight, branched or cyclic $C_1$-$C_{10}$ alkyl groups and optionally substituted $C_6$-$C_{20}$ aryl groups of $R^{L06}$ are the same as exemplified for $R^{L05}$. Exemplary monovalent $C_1$-$C_{15}$ hydrocarbon groups of $R^{L07}$ to $R^{L16}$ are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

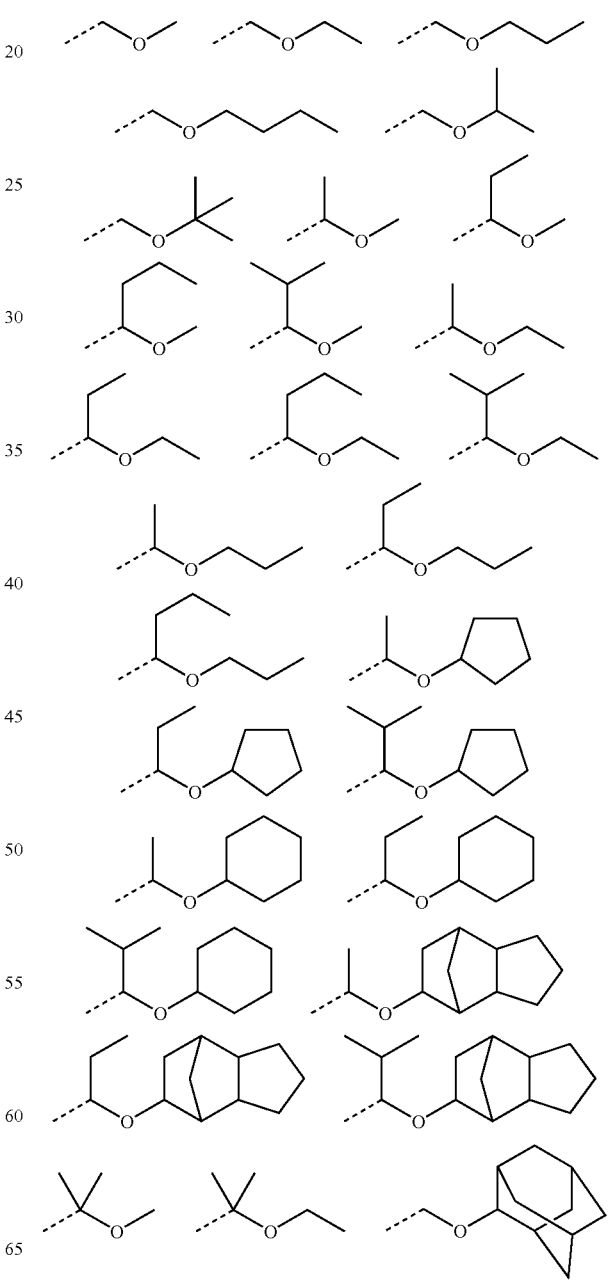

-continued

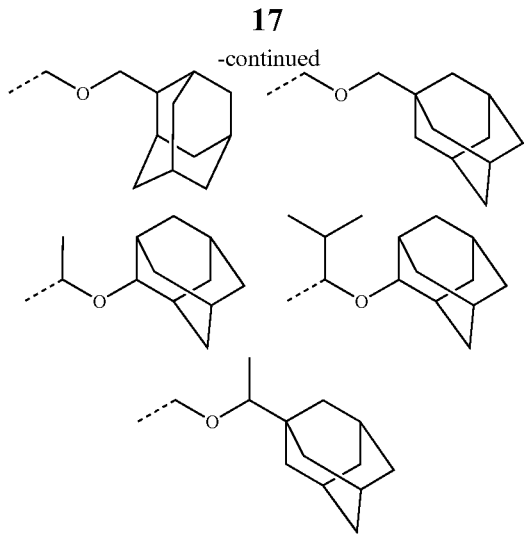

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

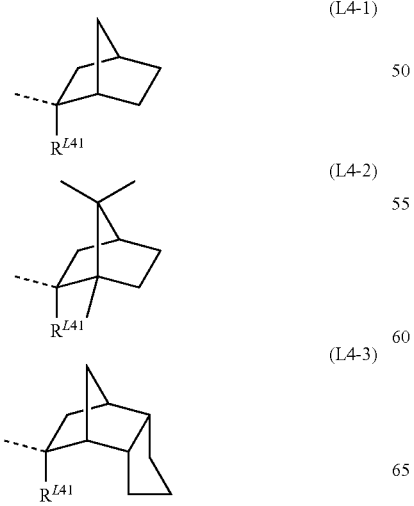

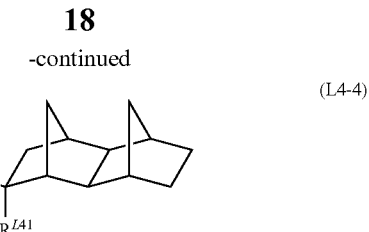

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

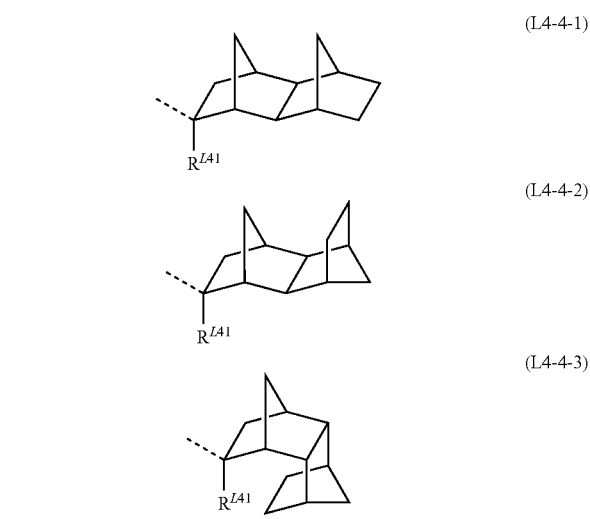

Note that $R^{L41}$ is as defined above.

Similarly, the general formula (L4-4) represents one or a mixture of two or more selected from groups having the following general formulas (L4-4-1) to (L4-4-4).

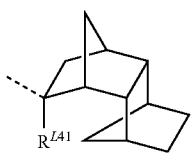
(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

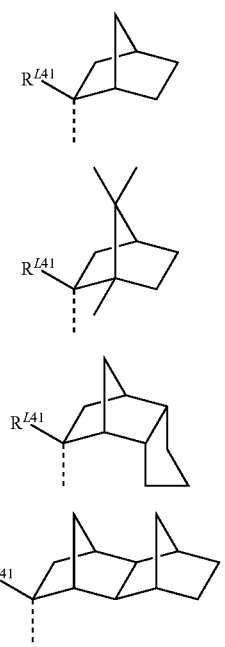

(L4-1-endo)
(L4-2-endo)
(L4-3-endo)
(L4-4-endo)

Note that $R^{L41}$ is as defined above.

Illustrative examples of the acid labile group of formula (L4) are given below.

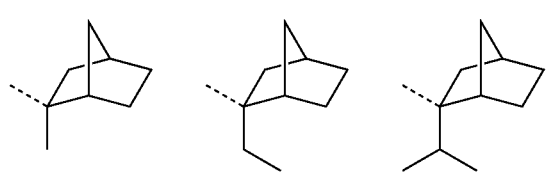

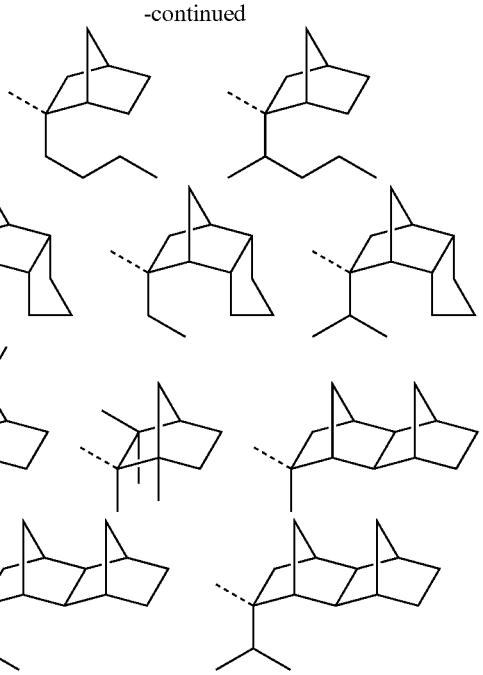

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^5$ and $R^7$, are as exemplified for $R^{L04}$ and the like.

Illustrative examples of the recurring units having formulae (2a) to (2f) are given below, but not limited thereto.

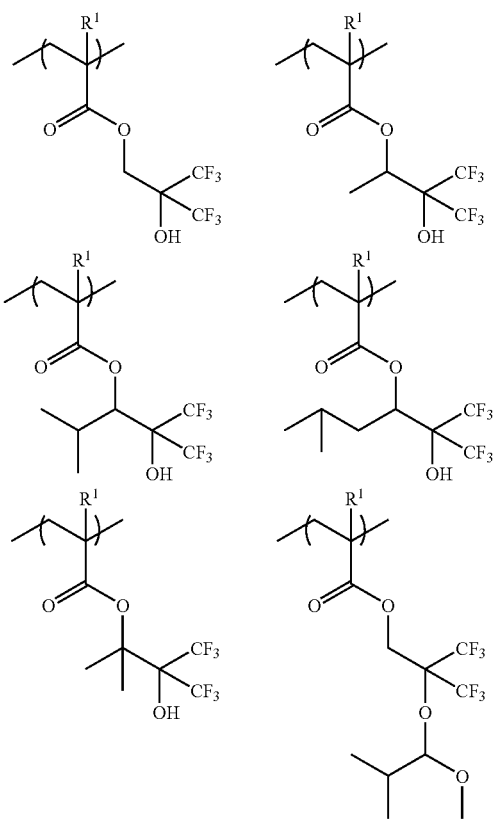

-continued
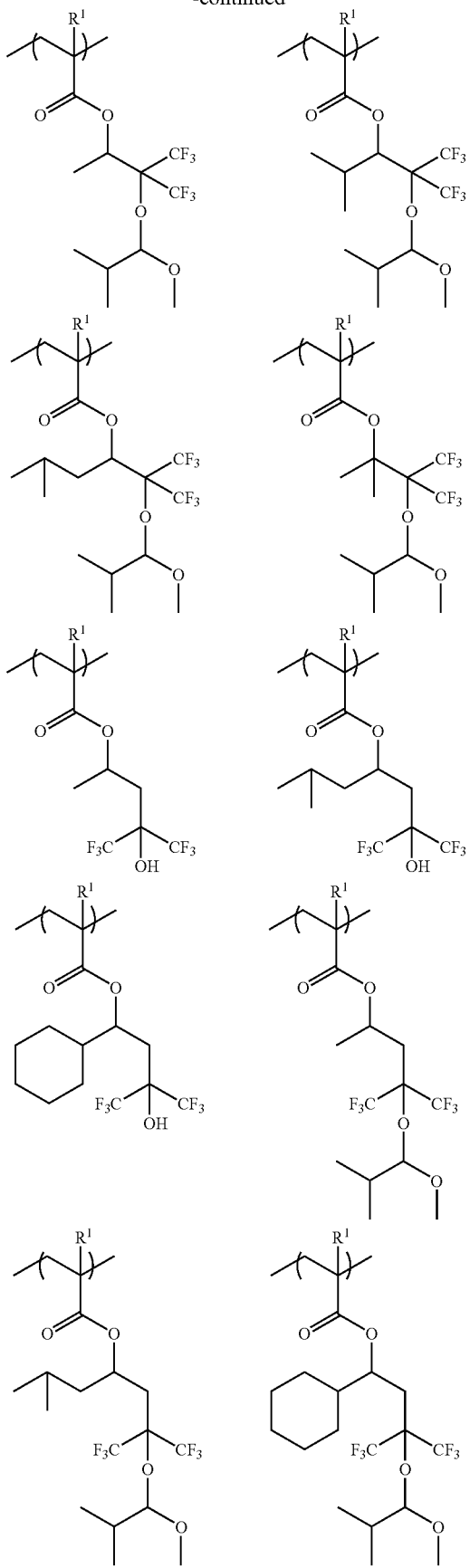
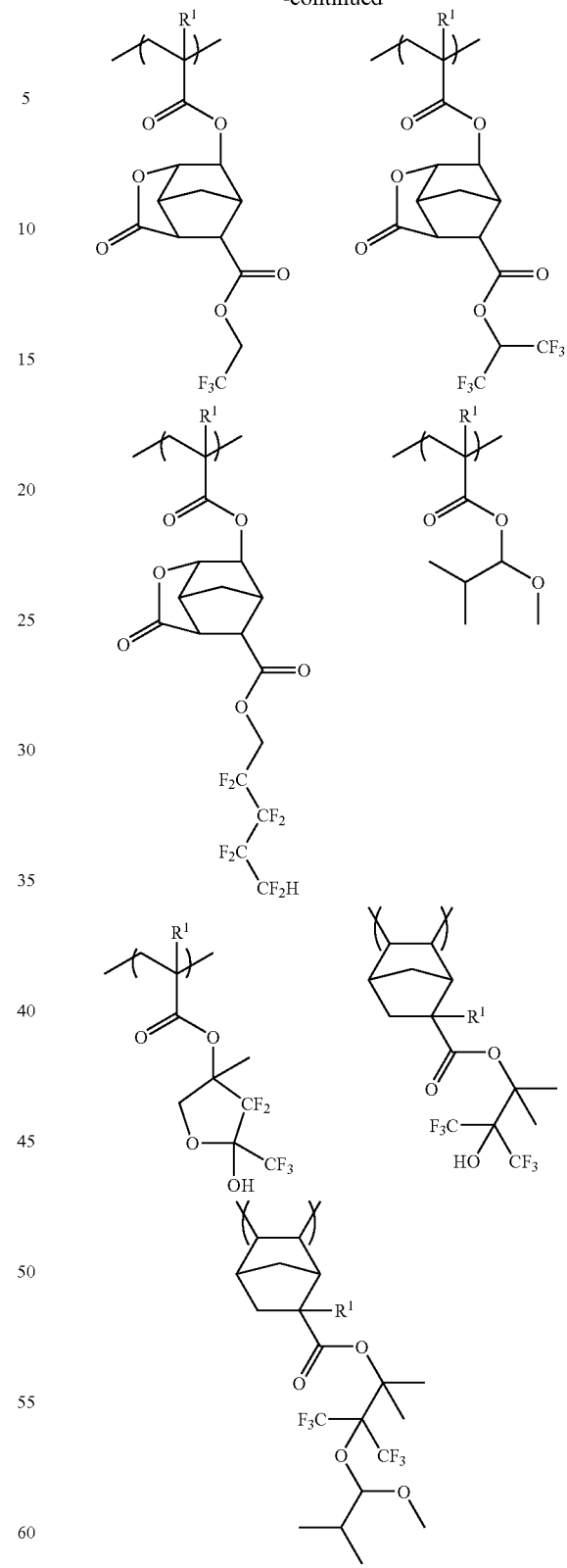
Note that $R^1$ is as defined above.
Although the polymer P1 comprising recurring units of formula (1) in combination with recurring units of formulae (2a) to (2f) exerts satisfactory performance, recurring units of one or more types selected from formulae (6a) to (6e), (7a) to (7e), (8a) to (8c), and (9a) to (9c) may be further incorporated therein for the purposes of imparting further water repellency and water slip, and controlling alkaline solubility and developer affinity.
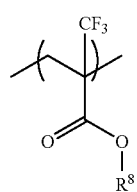
(6a)
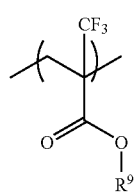
(6b)
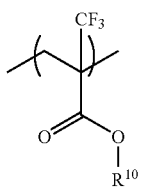
(6c)
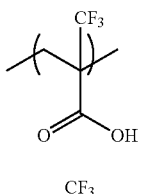
(6d)
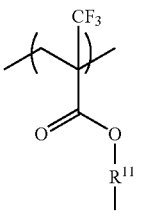
(6e)
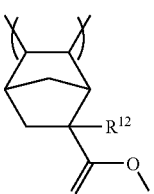
(7a)
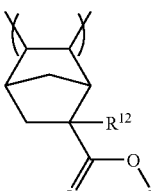
(7b)
-continued
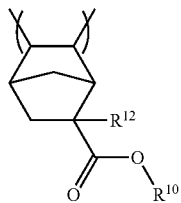
(7c)
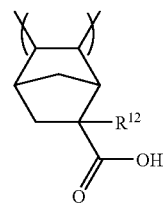
(7d)
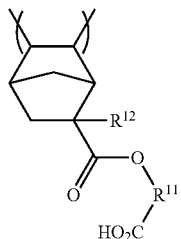
(7e)
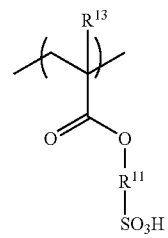
(8a)
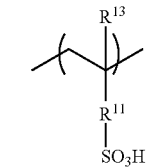
(8b)
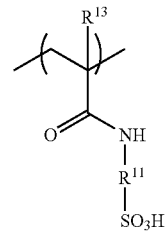
(8c)
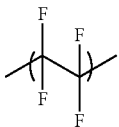
(9a)

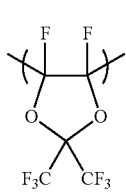 (9b)

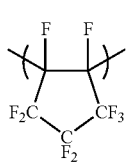 (9c)

Herein $R^8$ is a $C_1$-$C_{15}$ alkyl or fluoroalkyl group, $R^9$ is an adhesive group, $R^{10}$ is an acid labile group, $R^{11}$ is a single bond or divalent $C_1$-$C_{15}$ organic group, and $R^{12}$ and $R^{13}$ each are hydrogen, methyl or trifluoromethyl.

Examples of the $C_1$-$C_{15}$ alkyl group represented by $R^8$ are the same as illustrated for $R^{2a}$ and $R^{2b}$ in formula (1). Examples of the $C_1$-$C_{15}$ fluoroalkyl group represented by $R^8$ are the same as illustrated for $R^4$ in formula (1).

The adhesive group represented by $R^9$ may be selected from a variety of such groups, typically those groups shown below.

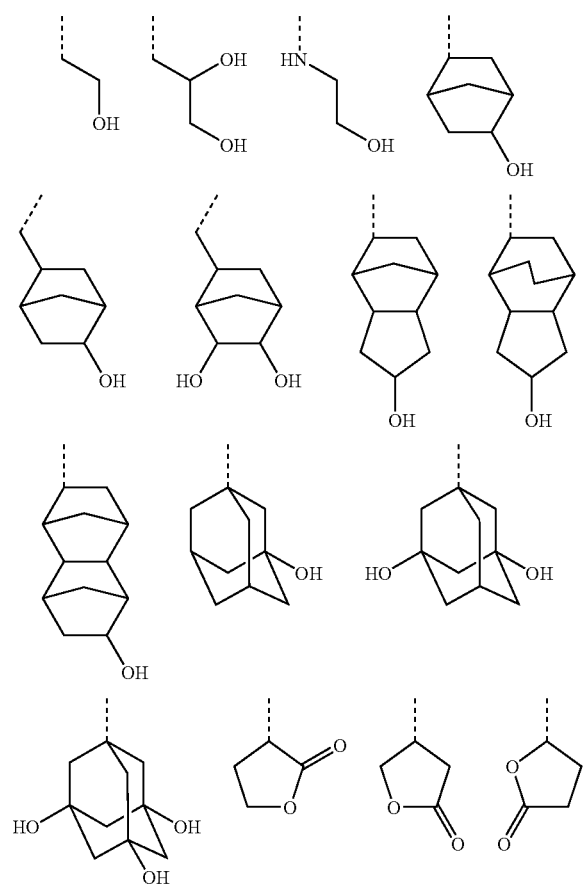

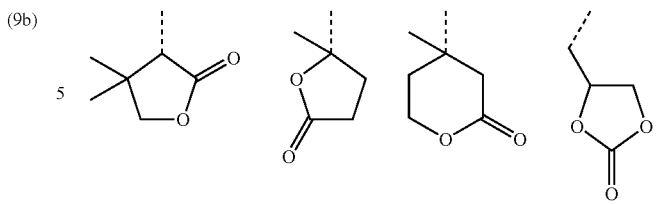
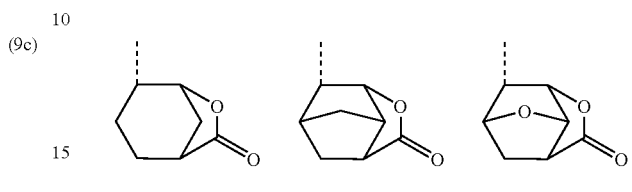
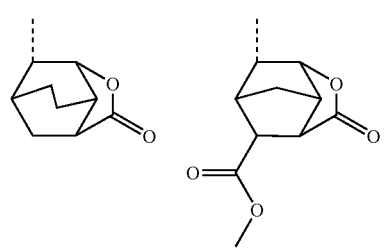
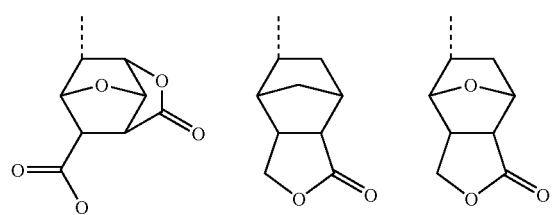
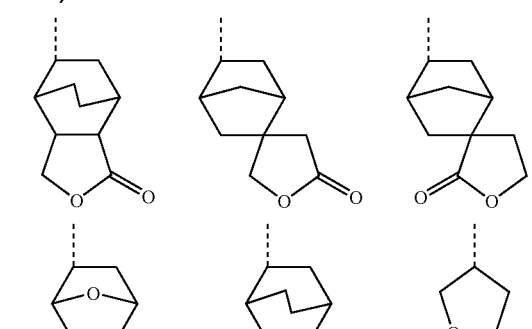
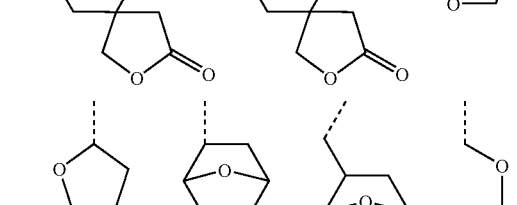
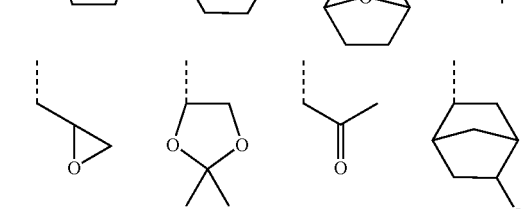
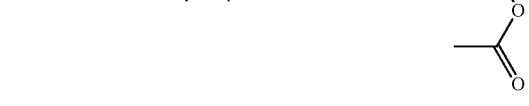

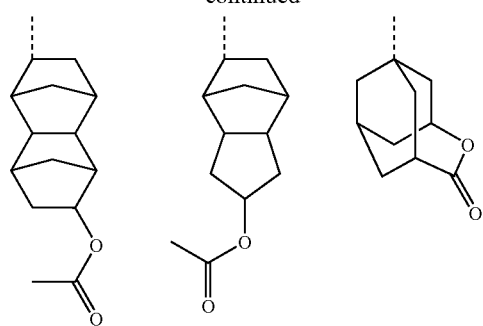
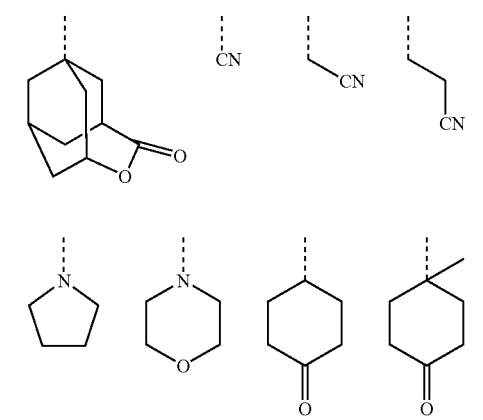
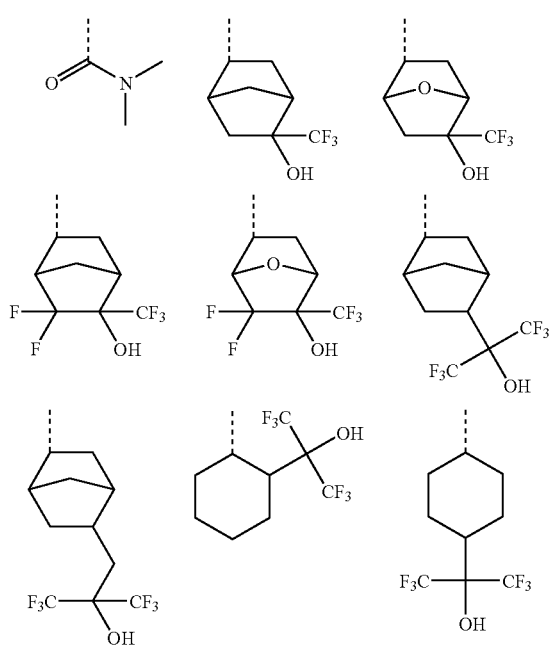
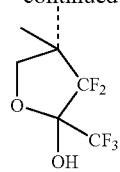

Herein, the broken line designates a valence bond.

The acid labile group represented by $R^{10}$ may be selected from those groups illustrated for $R^5$ and $R^7$.

Suitable divalent $C_1$-$C_{15}$ organic groups represented by $R^{11}$ include alkyl groups as exemplified for $R^{2a}$ and $R^{2b}$ in formula (1), with one hydrogen atom eliminated (e.g., methylene and ethylene). Also useful are groups of the following formulae.

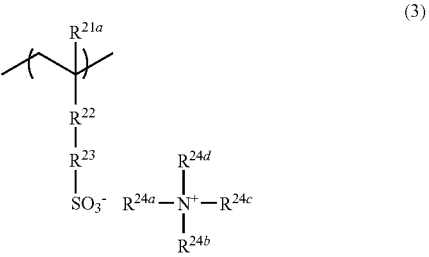

Herein, the broken line designates a valence bond.

The polymer P1 of the invention exerts satisfactory performance even when used alone. In a preferred embodiment, a second polymer P2 comprising recurring units of at least one type selected from formulae (3) to (5) may be used in blend with the polymer P1 for the purposes of imparting further water repellency and water slip, and controlling alkaline solubility and developer affinity.

(P2)

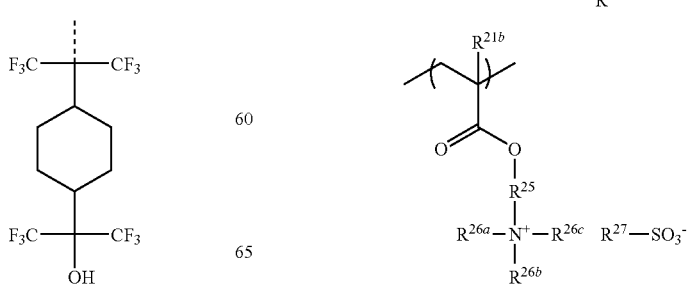

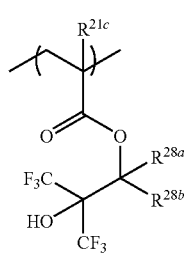

(5)

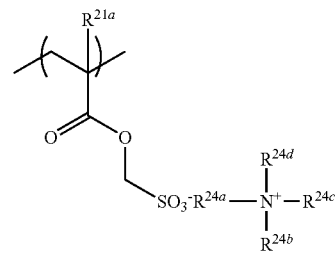

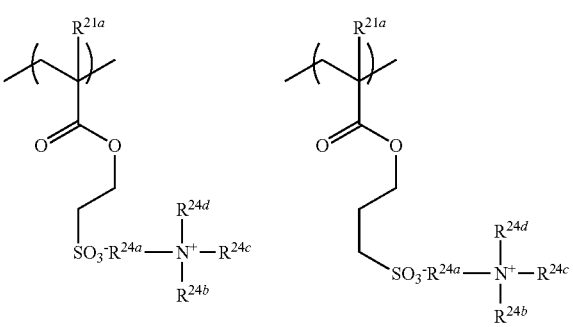

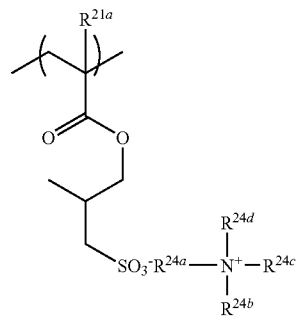

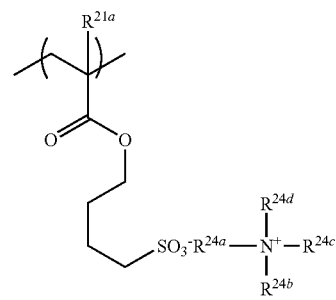

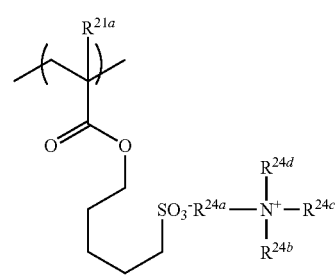

Herein $R^{21a}$ to $R^{21c}$ are hydrogen or methyl. $R^{22}$ is a single bond, $C_1$-$C_4$ alkylene, phenylene, —C(=O)—O—, or —C(=O)—NH—. $R^{23}$ is a single bond or a straight, branched or cyclic $C_1$-$C_8$ alkylene group. $R^{24a}$ to $R^{24d}$ and $R^{26a}$ to $R^{26c}$ are each independently hydrogen, a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which some or all hydrogen atoms may be substituted by alkoxy groups, $R^{24a}$ to $R^{24d}$ and $R^{26a}$ to $R^{26c}$ may contain a nitrogen atom, ether group, ester group, hydroxyl group or carboxyl group therein. Any two of $R^{24a}$ to $R^{24d}$ and any two of $R^{26a}$ to $R^{26c}$ may bond together to form a ring with the nitrogen atom to which they are attached, and when they form a ring, they are each independently a $C_3$-$C_{15}$ alkylene or a hetero-aromatic ring having the nitrogen atom therein. $R^{25}$ is a straight, branched or cyclic $C_1$-$C_8$ alkylene group. $R^{27}$ is a straight, branched or cyclic $C_1$-$C_{20}$ alkyl group which may contain carbonyl, ester, ether or halogen, or a $C_6$-$C_{15}$ aryl group which may contain carbonyl, ester, ether, halogen, or $C_1$-$C_{15}$ alkyl or fluoroalkyl. $R^{28a}$ and $R^{28b}$ are hydrogen or a straight, branched or cyclic $C_1$-$C_{15}$ alkyl group, or $R^{28a}$ and $R^{28b}$ may bond together to form a ring with the carbon atom to which they are attached.

Examples of the $C_1$-$C_4$ alkylene group represented by $R^{22}$ include methyl, ethyl, n-propyl, isopropyl, n-butyl, sec-butyl and tert-butyl groups, with one hydrogen atom eliminated.

Examples of the straight, branched or cyclic $C_1$-$C_8$ alkylene group represented by $R^{23}$ and $R^{25}$ include methyl, ethyl, n-propyl, isopropyl, n-butyl, sec-butyl, tert-butyl, tert-amyl, n-pentyl, n-hexyl, n-heptyl, n-octyl, cyclopentyl, cyclohexyl, cyclopentylmethyl, cyclopentylethyl, cyclohexylmethyl and cyclohexylethyl groups, with one hydrogen atom eliminated.

In formula (3), the ammonium salt (cationic moiety) formed by $R^{24a}$ to $R^{24d}$ is obtained from neutralization reaction of a corresponding amine compound. Suitable amine compounds include primary, secondary and tertiary aliphatic amines, mixed amines, aromatic amines, heterocyclic amines, nitrogen-containing compound having carboxyl group, nitrogen-containing compound having sulfonyl group, nitrogen-containing compound having hydroxyl group, nitrogen-containing compound having hydroxyphenyl group, amides, imides, and carbamates. Illustrative examples of the amine compound which can be used herein include those described in U.S. Pat. No. 7,537,880 (JP-A 2008-111103, paragraphs [0146] to [0164]).

Examples of $R^{26a}$ to $R^{26c}$ and $R^{27}$ will become apparent from illustrative examples of formula (4).

Examples of the $C_1$-$C_{15}$ alkyl group represented by $R^{28a}$ and $R^{28b}$ are the same as illustrated for $R^{2a}$ and $R^{2b}$ in formula (1).

Illustrative examples of the recurring units of formula (3) are given below, but not limited thereto.

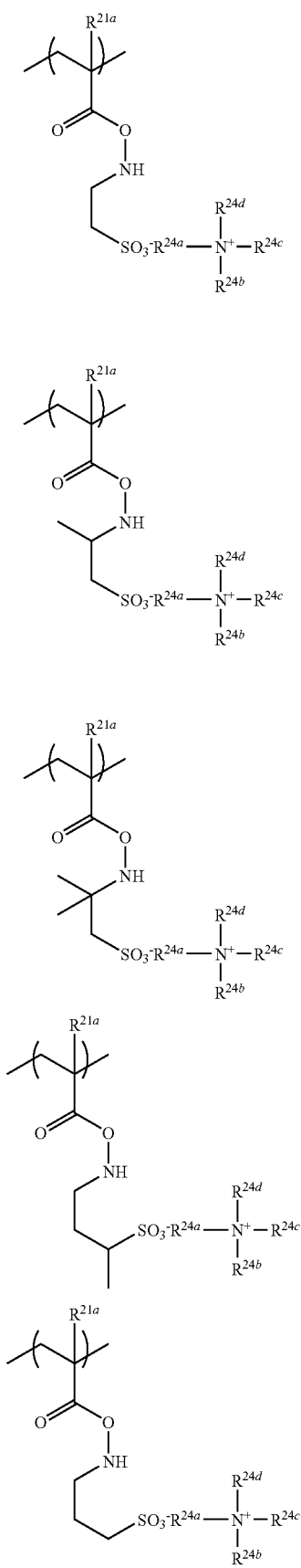
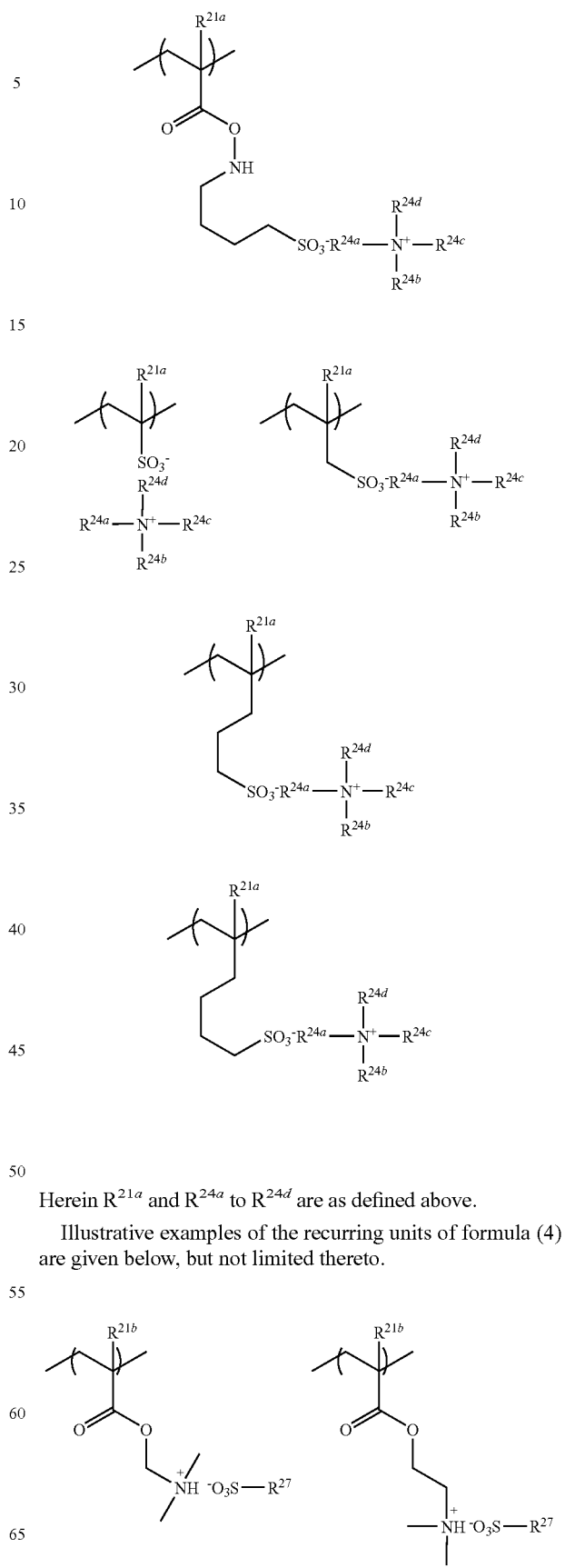
Herein $R^{21a}$ and $R^{24a}$ to $R^{24d}$ are as defined above.
Illustrative examples of the recurring units of formula (4) are given below, but not limited thereto.

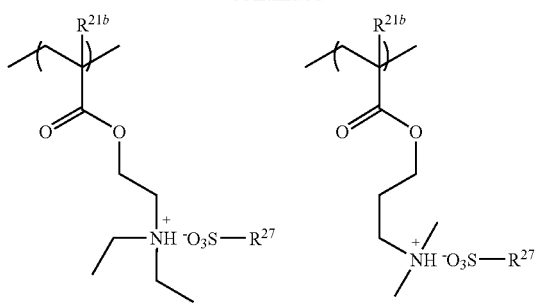
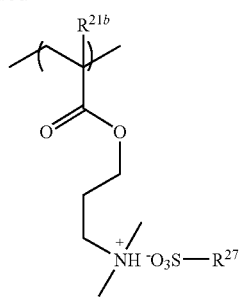
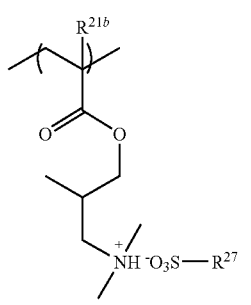
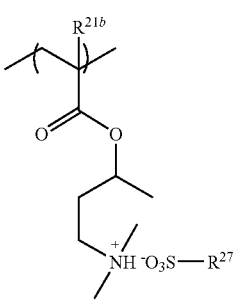
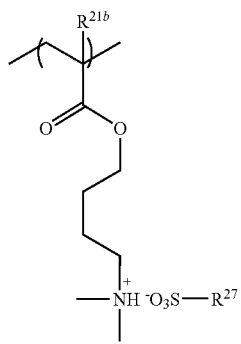
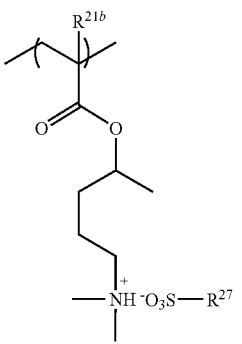
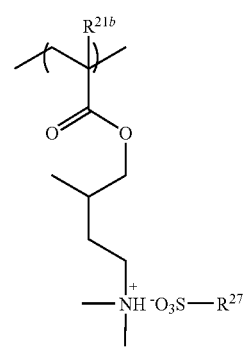
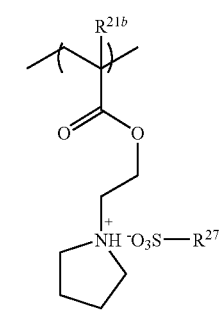
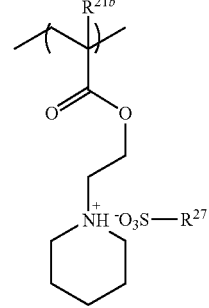
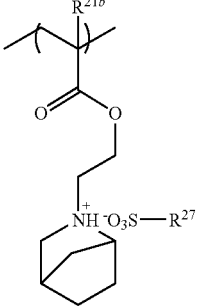
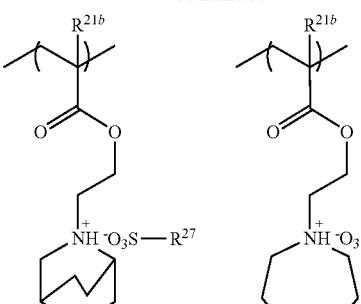
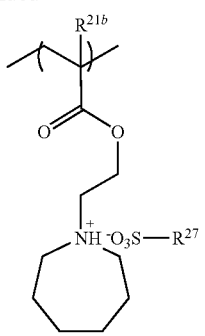
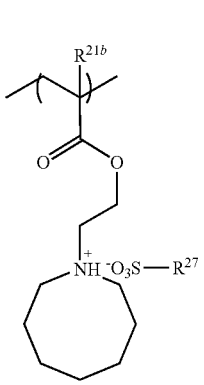
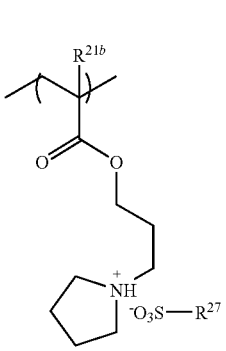
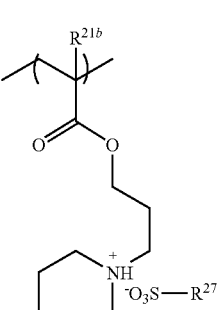
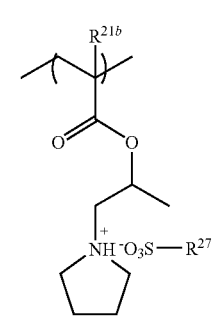
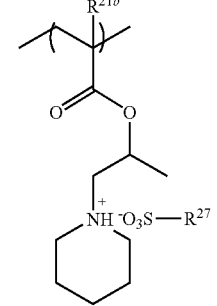
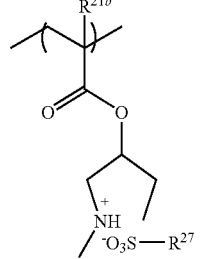
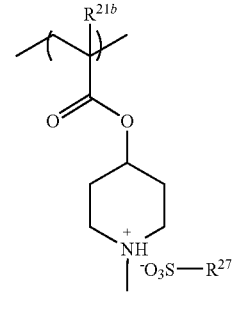
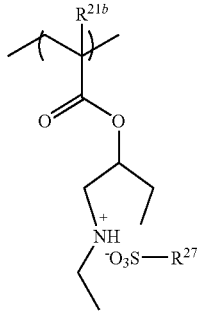

-continued

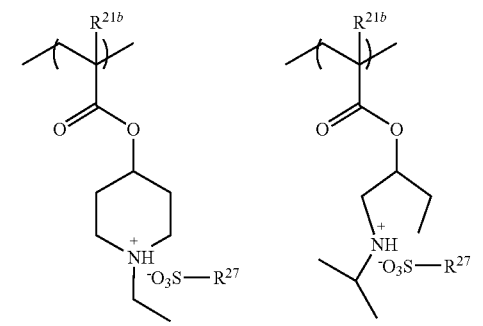
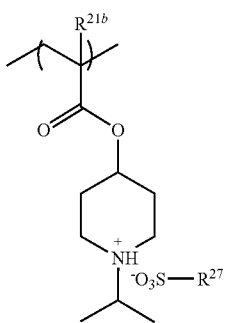
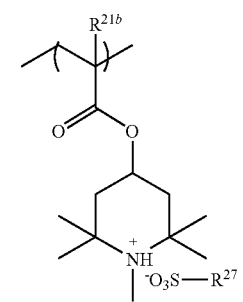
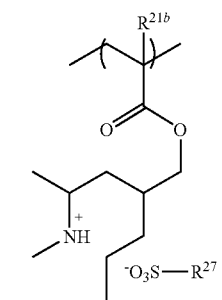
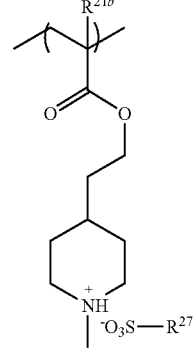

-continued

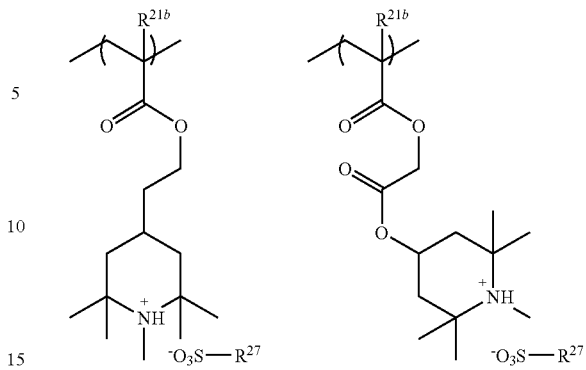
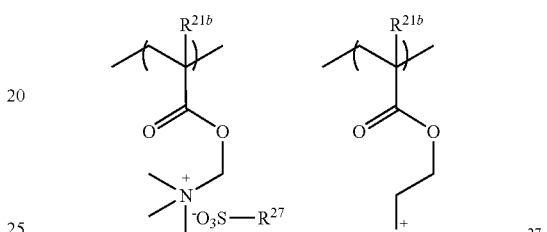
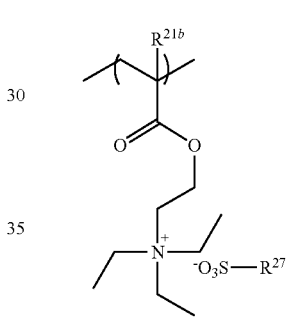
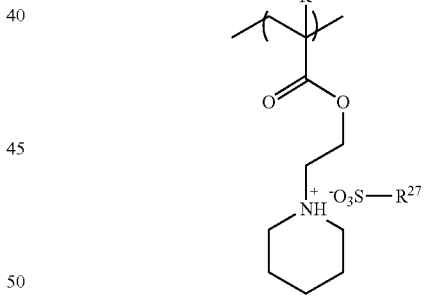

Herein $R^{21b}$ and $R^{27}$ are as defined above.

Examples of the sulfonic acid salt used in the recurring units of formula (4) include fluoroalkylsulfonates such as triflate, 1,1,1-trifluoroethanesulfonate and nonafluorobutanesulfonate; arylsulfonates such as tosylate, benzenesulfonate, 4-fluorobenzenesulfonate, 1,2,3,4,5-pentafluorobenzenesulfonate, xylenesulfonate, mesitylenesulfonate, p-t-butylbenzenesulfonate, naphthalenesulfonate, anthracenesulfonate, and pyrenesulfonate; and alkylsulfonates such as mesylate, butanesulfonate, octanesulfonate, camphorsulfonate, adamantanesulfonate, norbornanesulfonate, cyclohexylsulfonate, cyclopentanesulfonate, cyclobutanesulfonate, cyclopropanesulfonate, and dodecylbenzenesulfonate.

Illustrative, non-limiting examples of the recurring units of formula (5) are given below.

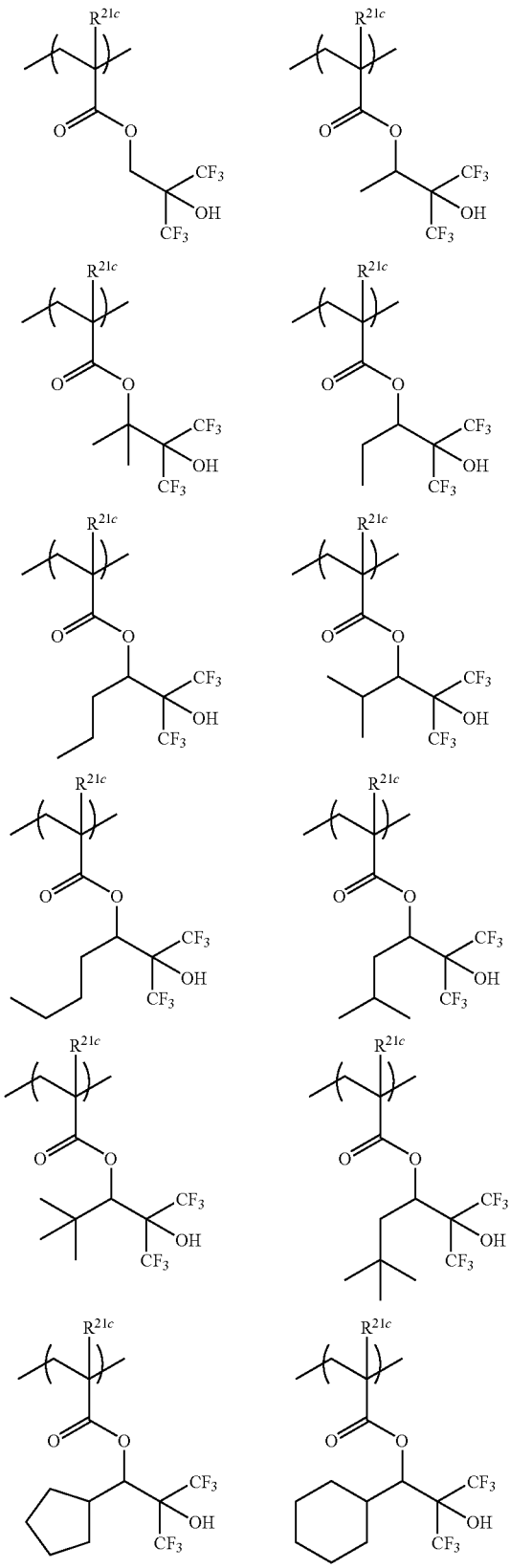

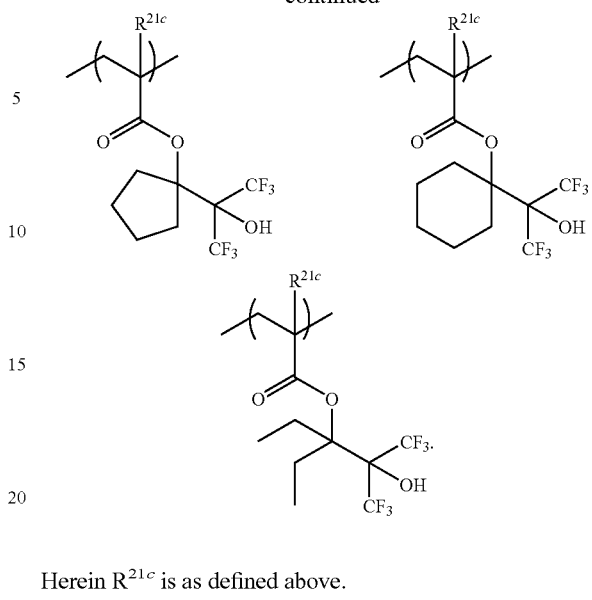

-continued

Herein $R^{21c}$ is as defined above.

Although the polymer P2 comprising only recurring units of formulae (3) to (5) in combination exerts satisfactory performance, recurring units of one or more types selected from the foregoing formulae (6a) to (6e), (7a) to (7e), (8a) to (8c), and (9a) to (9c) may be further incorporated therein for the purposes of imparting further water repellency and water slip, and controlling alkaline solubility and developer affinity.

Monomer Synthesis

The polymer P1 used in the resist protective coating composition of the invention is characterized by comprising recurring units having formula (1). These recurring units are derived from a monomer which may be synthesized by any well-known methods, for example, the method of US 20070179309 (JP-A 2007-204385).

The monomer (1') corresponding to units of formula (1) may be prepared in accordance with the following reaction scheme, for example, although the process is not limited thereto.

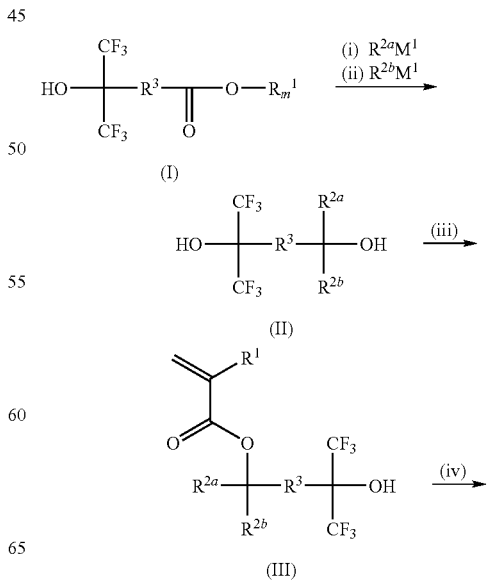

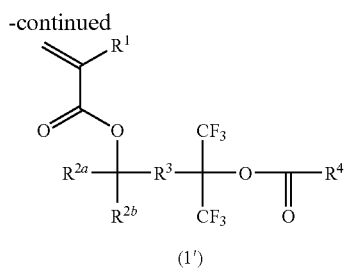

(1')

Herein $R^1$, $R^{2a}$, $R^{2b}$, $R^3$, and $R^4$ are as defined above, $Rm^1$ is hydrogen or a straight, branched or cyclic monovalent hydrocarbon group of 1 to 6 carbon atoms, and $M^1$ is one or more elements selected from among Li, Na, K, Mg, Zn, Al, B, and Si which may be optionally substituted.

In the first step, the reactant, 3,3,3-trifluoro-2-trifluoromethyl-2-hydroxypropionic acid derivative (I) is reacted with reducing agents or organometallic reagents ($R^{2a}M^1$ and $R^{2b}M^1$) to form a fluoroalcohol (II).

Examples of $Rm^1$ include hydrogen, methyl, ethyl, n-propyl, isopropyl, n-butyl, sec-butyl, tert-butyl, cyclopentyl and cyclohexyl.

Examples of the reducing agents or organometallic reagents ($R^{2a}M^1$ and $R^{2b}M^1$) include complex hydrides such as sodium borohydride, lithium borohydride, potassium borohydride, calcium borohydride, sodium aluminum hydride, lithium aluminum hydride, lithium triethylborohydride, lithium tri-s-butylborohydride, and potassium tri-s-butyl-borohydride, and alkoxy or alkyl derivatives thereof; organolithium reagents such as methyllithium and n-butyllithium; Grignard reagents such as methylmagnesium chloride, ethylmagnesium chloride, isopropylmagnesium chloride, and 1,4-bis(chloromagnesio)butane; organozinc reagents such as dimethylzinc; and triethylsilane.

Although the amount of reducing agent or organometallic reagent used varies with reaction conditions, it is desirably in a range of 2.0 to 5.0 moles and more preferably 2.0 to 3.0 moles per mole of the reactant, fluorine compound (I).

Suitable solvents include ethers such as tetrahydrofuran, diethyl ether, di-n-butyl ether, and 1,4-dioxane; hydrocarbons such as n-hexane, n-heptane, benzene, toluene, xylene, and cumene; alcohols such as methanol, ethanol, isopropyl alcohol, and tert-butyl alcohol; and aprotic polar solvents such as dimethyl sulfoxide (DMSO), N,N-dimethylformamide (DMF), and acetonitrile. These solvents may be used alone or in admixture.

The reaction temperature and time widely vary depending on other reaction conditions. Where a Grignard reagent is used as the organometallic reagent, for example, the reaction temperature is in a range of 0 to 100° C., preferably 20 to 70° C. It is desirable from the standpoint of yield that the reaction time is determined so as to drive the reaction to completion by monitoring the reaction process by gas chromatography (GC) or silica gel thin-layer chromatography (TLC). Usually, the reaction time is about 0.5 to 10 hours. From the reaction mixture, the desired fluoroalcohol compound (II) is recovered through an ordinary aqueous workup. If necessary, the compound may be purified by a standard technique such as distillation or recrystallization.

In the second step, the fluoroalcohol compound (II) is esterified into a compound (III). The reaction runs readily by any well-known procedure. The preferred esterifying agent is an acid chloride, carboxylic acid or acid anhydride. When an acid chloride is used as the esterifying agent, the reaction may be conducted in a solventless system or in a solvent such as methylene chloride, toluene or hexane, by sequentially or simultaneously adding alcohol (II), a corresponding acid chloride (e.g., methacrylic acid chloride or α-trifluoromethylacrylic acid chloride), and a base (e.g., triethylamine, pyridine or 4-dimethylaminopyridine), and optionally cooling or heating the reaction system.

When a carboxylic acid is used as the esterifying agent, the reaction may be conducted in a solvent such as toluene or hexane, by adding alcohol (II), a corresponding carboxylic acid (e.g., methacrylic acid or α-trifluoromethylacrylic acid), and a mineral acid (e.g., hydrochloric acid, sulfuric acid, nitric acid or perchloric acid), or an organic acid (e.g., p-toluenesulfonic acid, benzenesulfonic acid or trifluoroacetic acid), heating the contents, and optionally removing the water formed during reaction from the system. Alternatively, the reaction may be conducted in a solventless system or in a solvent such as toluene or hexane, by sequentially or simultaneously adding alcohol (II), an aliphatic sulfonyl chloride (e.g., methanesulfonyl chloride) or aromatic sulfonyl chloride (e.g., p-toluenesulfonyl chloride), an acid anhydride (e.g., acetic anhydride or trifluoroacetic anhydride), and optionally a base (e.g., triethylamine, pyridine or 4-dimethylaminopyridine), and optionally cooling or heating the reaction system.

When an acid anhydride is used as the esterifying agent, the reaction may be conducted in a solventless system or in a solvent such as methylene chloride, toluene or hexane, by sequentially or simultaneously adding alcohol (II), a corresponding acid anhydride (e.g., methacrylic anhydride or α-trifluoromethylacrylic anhydride), and a mineral acid (e.g., hydrochloric acid, sulfuric acid, nitric acid or perchloric acid), an organic acid (e.g., p-toluenesulfonic acid, benzenesulfonic acid or trifluoroacetic acid) or a base (e.g., triethylamine, pyridine or 4-dimethylaminopyridine), and optionally cooling or heating the reaction system. Where the acid anhydride is used as the esterifying agent, a mixed acid anhydride consisting of a carboxylic acid (e.g., formic acid, acetic acid or trifluoroacetic acid), a sulfonic acid (e.g., methanesulfonic acid or p-toluenesulfonic acid), and a phenol (e.g., phenol or p-nitrophenol) or the like may be used.

The third step is to esterify the hydroxyl group of the resulting methacrylate (III) to provide the desired monomer (1). This esterifying reaction may be done by the same procedure as in the second step.

Synthesis of Polymer

The polymers P1 and P2 used in the protective coating composition may be synthesized by general polymerization processes including radical polymerization using initiators such as 2,2'-azobisisobutyronitrile (AIBN), and ionic (or anionic) polymerization using alkyllithium or the like. The polymerization may be carried out by its standard technique. Preferably the polymers P1 and P2 are synthesized by radical polymerization while the polymerization conditions may be determined in accordance with the type and amount of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis (2,4,4-trimethylpentane), and dimethyl 2,2'-azobis (isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 6 mol % based on the total moles of monomers to be polymerized.

During the synthesis of polymer P1 or P2, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

Polymer P1 may be synthesized by combining suitable monomers selected from polymerizable monomers corresponding to recurring units of formulae (1), (2a) to (2f), (6a) to (6e), (7a) to (7e), (8a) to (8c), and (9a) to (9c), adding an initiator and chain transfer agent to the monomer mixture, and effecting polymerization. Similarly, polymer P2 may be synthesized by combining suitable monomers selected from polymerizable monomers corresponding to recurring units of formulae (3) to (5), (6a) to (6e), (7a) to (7e), (8a) to (8c), and (9a) to (9c), adding an initiator and chain transfer agent to the monomer mixture, and effecting polymerization.

In polymer P1 wherein U11 stands for a total molar number of a monomer corresponding to units of formula (1), U12 stands for a total molar number of monomers corresponding to units of formulae (2a) to (2f), and U13 stands for a total molar number of monomers corresponding to units of formulae (6a) to (6e), (7a) to (7e), (8a) to (8c), and (9a) to (9c), with the proviso that U11+U12+U13=U1 (=100 mol %), values of U11, U12, and U13 are preferably determined so as to meet:

$0 \leq U11/U1 < 1$, more preferably $0.1 \leq U11/U1 \leq 0.7$, even more preferably $0.2 \leq U1/U1 \leq 0.6$, $0 \leq U12/U1 < 1$, more preferably $0.3 \leq U12/U1 \leq 0.9$, even more preferably $0.4 \leq U12/U1 \leq 0.8$, and $0 \leq U13/U1 < 1$, more preferably $0 \leq U13/U1 \leq 0.5$, even more preferably $0 \leq U13/U1 \leq 0.3$.

In polymer P2 wherein U21 stands for a total molar number of a monomer corresponding to units of formula (3), U22 stands for a total molar number of a monomer corresponding to units of formula (4), U23 stands for a total molar number of a monomer corresponding to units of formula (5), and U24 stands for a total molar number of monomers corresponding to units of formulae (6a) to (6e), (7a) to (7e), (8a) to (8c), and (9a) to (9c), with the proviso that U21+U22+U23+U24=U2 (=100 mol %), values of U21, U22, U23, and U24 are preferably determined so as to meet:

$0 \leq U21/U2 < 1$, more preferably $0.01 \leq U21/U2 \leq 0.5$, even more preferably $0.03 \leq U21/U2 \leq 0.2$, $0 \leq U22/U2 < 1$, more preferably $0.01 \leq U22/U2 \leq 0.5$, even more preferably $0.03 \leq U22/U2 \leq 0.2$, $0 < (U21+U22)/U2 \leq 1$, more preferably $0.01 \leq (U21+U22)/U2 \leq 0.5$, even more preferably $0.03 \leq (U21+U22)/U2 \leq 0.2$, $0 \leq U23/U2 < 1$, more preferably $0.5 \leq U23/U2 \leq 0.99$, even more preferably $0.7 \leq U23/U2 \leq 0.97$, and $0 \leq U24/U2 < 1$, more preferably $0 \leq U24/U2 < 0.5$, even more preferably $0 \leq U24/U2 < 0.3$.

For polymerization, a solvent may be used if desired. Preferred is the solvent which does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Desirably polymers P1 and P2 have a weight average molecular weight (Mw) of 1,000 to 500,000, and especially 2,000 to 30,000, as determined by gel permeation chromatography (GPC) using polystyrene standards. This is because a polymer with too low a Mw may be miscible with the resist material or more dissolvable in water whereas too high a Mw may interfere with film formation after spin coating and lead to a decline of alkali solubility.

In polymers P1 and P2, $R^5$ in formulae (2a), (2b) and (2f) and $R^{10}$ in formulae (6c) and (7c) may be introduced by post-protection reaction. Specifically, a monomer wherein $R^5$ or $R^{10}$ is hydrogen is previously polymerized to synthesize a precursor polymer. Post-protection reaction is effected on the precursor polymer for substituting acid labile groups $R^5$ or $R^{10}$ for some or all hydroxyl groups on the precursor polymer as shown below.

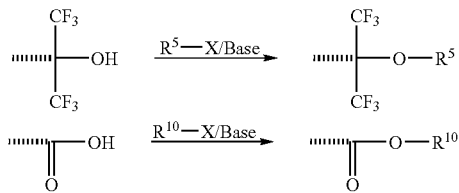

Herein $R^5$ and $R^{10}$ are as defined above.

The desired polymer is obtainable via post-protection reaction by reacting the precursor polymer with a base in an amount of 1 to 2 equivalents relative to the desired degree of substitution of hydroxyl groups, and then with R—X (wherein R is $R^5$ or $R^{10}$ as defined above and X is chlorine, bromine or iodine) in an amount of 1 to 2 equivalents relative to the base.

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyllithium, lithium diisopropylamide, triethylamine, and pyridine.

In polymer P2, the ammonium salt in recurring units of formula (3) may be obtained from neutralization reaction of a (meth)acrylate having a sulfo pendant group with a corresponding amine or ion exchange reaction thereof with an ammonium salt having the following general formula.

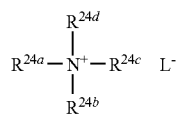

Herein $R^{24a}$ to $R^{24d}$ are as defined above, $L^-$ is $OH^-$, $Cl^-$, $Br^-$, $I^-$, $R^{29}CO_2^-$, or $NO_3^-$, and $R^{29}$ is hydrogen or a monovalent organic group.

In polymer P2, recurring units of formula (3) may be introduced by effecting neutralization reaction or ion exchange reaction at the monomer stage or after polymer synthesis. In the latter case, if the amount of amine added is small, an amine salt is not uniformly formed within polymer units which may cause local bridge defects upon pattern formation. To avoid such inconvenience, it is preferred that neutralization or ion exchange reaction be carried out in a monomer form, and this be followed by polymerization using the resulting monomer having a sulfonic acid amine salt uniformly distributed.

When recurring units of formula (4) are introduced in polymer P2, those units containing a tertiary or lower ammonium salt may be obtained from neutralization reaction of a (meth)acrylate having an amino pendant group with a corresponding sulfonic acid. Those units containing a quaternary ammonium salt may be obtained from ion exchange reaction as described above. As in the case of recurring units of formula (3), neutralization reaction or ion exchange reaction may be effected either at the monomer stage or after polymer synthesis.

With respect to the recurring units of formula (3) in polymer P2, a degree of neutralization between sulfo group and amine compound in an overall polymer may be such that with a less amine equivalent, sulfonic acid residues are present or inversely, amine is in excess. Where sulfonic acid residues are available, the protective coating, when combined with a photoresist, is effective for preventing bridges between features of a resist pattern after development. On the other hand, where an excess of amine is available, the protective coating is effective for improving the rectangularity of a resist pattern. With these considerations, the amounts of sulfo group and amine may be adjusted as appropriate while monitoring a resist pattern after development. The same applies to the recurring units of formula (4).

Protective Coating Composition

In one embodiment, the invention provides a resist protective coating composition comprising the polymer P1 defined above. Polymer P1 comprises recurring units of formula (1) which contain a hexafluoroalcohol structure whose hydroxyl group is protected with acyl. By a choice of resin structure, it is possible to tailor any of properties including water repellency, water slip, fat solubility, acid lability, hydrolysis, and alkaline solubility.

Since polymer P2 contains a hydrophilic sulfonic acid amine salt in recurring units, it tends to segregate on the resist side after spin coating. As a result, the resist surface after development becomes hydrophilic, inhibiting blob defects. If a polymer having only sulfo groups is used as a protective coating material, part of the quencher in the resist film migrates to the protective coating layer. In case quencher migration occurs, the quencher concentration at the outermost surface of the resist film lowers, and the resist pattern after development may be concomitantly thinned and as a result, weakened in etch resistance. In contrast, a protective coating layer of polymer P2 in which a sulfonic acid amine salt is present prohibits quencher migration as mentioned above and ensures to form a rectangular resist pattern.

When a blend of polymers P1 and P2 is used, layer separation occurs during spin coating such that polymer P1 featuring water repellency and water slip segregates in a protective coating upper layer and polymer P2 featuring hydrophilicity segregates in a protective coating lower layer on top of the resist film. This results in a protective coating having improved water repellency and water slip on the resist surface and effective in inhibiting blob defects.

While polymers P1 and P2 may be mixed at any desired ratio, polymer P1 is typically present in a weight ratio of 5 to 95%, preferably 20 to 93%, and more preferably 30 to 90% based on the entire resin.

Typically a blend of polymers P1 and P2 is used as a base resin in a protective coating composition while another polymer may be mixed therewith for the purpose of altering some properties of a protective coating such as dynamic physical properties, thermal properties, alkaline solubility, water repellency, and water slip. The other polymer which is mixed is not particularly limited, and any of well-known polymers useful in the protective topcoat application may be chosen and mixed in any desired ratio.

Most often, the polymers are dissolved in a suitable solvent to form a solution which is ready for use as the resist protective coating composition. For film formation by spin coating technique, the solvent is preferably used in such amounts to provide a concentration of 0.1 to 20% by weight, more preferably 0.5 to 10% by weight of the polymers.

Although the solvent used herein is not particularly limited, those solvents in which resist layers are not dissolvable are preferred. Suitable solvents in which resist layers are not dissolvable include nonpolar solvents, for example, higher alcohols of at least 4 carbon atoms, toluene, xylene, anisole, hexane, cyclohexane, decane, and ethers. Of these, higher alcohols of at least 4 carbon atoms and ether compounds of 8 to 12 carbon atoms are most desirable. Examples of suitable solvents include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol as well as diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether. These solvents may be used alone or in admixture.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluortripropylamine, 1H, 1H, 2H, 3H, 3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

In the resist protective coating composition, a basic compound may be used for the purpose of performance amelioration such as pattern profile correction. For example, polymer P1 has acidic hydroxyl groups in recurring units with a possibility that part of the quencher in the resist film migrates to the protective coating layer. As discussed above, in case quencher migration occurs, the quencher concentration at the outermost surface of the resist film lowers, and the resist pattern after development is concomitantly thinned. A basic compound is previously added to the protective coating composition to avoid such quencher migration, preventing any degradation of pattern profile.

Preferred basic compounds are nitrogen-containing organic compounds which may be used alone or in admixture. Suitable nitrogen-containing organic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, amide, imide and carbamate derivatives. Illustrative examples are described in U.S. Pat. No. 7,537,880 (JP-A 2008-111103, paragraphs [0149] to [0163]). The basic compound is preferably used in an amount of 0.001 to 2 parts, more preferably 0.01 to 1 part by weight per 100 parts by weight of the base resin.

Pattern Forming Process

The pattern forming process in a preferred embodiment involves at least the steps of forming a photoresist film on a substrate, forming a protective coating on the photoresist film from the resist protective coating composition of the invention, exposing the layer structure to light, and development with a developer.

First a photoresist material is applied onto a substrate and prebaked to form a photoresist film thereon. The protective coating solution is then applied onto the photoresist film by spin coating, and prebaked on a hot plate at 50 to 150° C. for 1 to 10 minutes, preferably at 70 to 140° C. for 1 to 5 minutes, to form a protective coating. The protective coating preferably has a thickness of 10 to 500 nm.

If the protective coating solution is spin coated onto the surface of the resist film which has been wetted with a suitable solvent, the amount of the protective coating solution dispensed can be reduced. The means of wetting the resist surface include spin coating and vapor priming, with the spin coating technique being often employed. The solvent used for wetting may be selected from the aforementioned higher alcohols, ethers, and fluorinated solvents in which the resist is not dissolved.

A mask having the desired pattern is then placed over the photoresist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. Light exposure is preferably by immersion lithography of providing a liquid between the protective coating and the projection lens, though not limited thereto. The exposure may be either dry exposure in air or nitrogen atmosphere or vacuum exposure as in the case of EB or EUV lithography. In the immersion lithography, a light source producing emission having a wavelength in the range of 180 to 250 nm is preferred, and water is preferably used as the liquid between the protective coating and the lens.

In the immersion lithography, whether or not the wafer edge and rear side are cleaned and the cleaning technique are important in preventing flowing of water to the wafer rear side and leaching from the substrate. For example, after spin coating, the resist protective coating is baked at a temperature of 40 to 130° C. for 10 to 300 seconds for evaporating off the solvent. In the case of resist layer formation and dry lithography, edge cleaning is performed during the spin coating. In the case of immersion lithography, however, such edge cleaning is undesirable because water may be left on the hydrophilic substrate surface at the edge. It is then recommended to omit edge cleaning during the spin coating of the resist protective coating.

Exposure is followed by post-exposure bake (PEB) on a hot plate at 60 to 150° C. for 1 to 5 minutes, preferably at 80 to 140° C. for 1 to 3 minutes. Sometimes water is left on the protective coating prior to PEB. If PEB is performed in the presence of residual water, water can penetrate through the protective coating to suck up the acid in the resist, impeding pattern formation. Such inconvenience must be avoided by fully removing the water on the protective coating prior to PEB. The water on the protective coating should be dried or recovered by suitable means, for example, spin drying, purging of the protective coating surface with dry air or nitrogen, or optimizing the water recovery nozzle configuration on a stage or water recovery process. Additionally, the design and utilization of a material having high water repellency and water slip, typically the protective coating composition of the invention, offers the advantage of efficient water removal.

After PEB, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes.

A typical developer is a 2.38 wt % TMAH aqueous solution. These steps result in the formation of the desired pattern on the substrate. Where the resist protective coating composition is used, the protective coating composition itself exhibits alkaline solubility so that the protective coating can be stripped at the same time as development.

Where a pattern is formed using the protective coating composition, the resist material of which the underlying resist layer is made is not particularly limited. The resist type may be either positive or negative working and also either a monolayer resist of conventional hydrocarbon or a bilayer (or multilayer) resist containing silicon atoms or the like.

For KrF lithography resist materials, the preferred base resins are polyhydroxystyrene or polyhydroxystyrene-(meth) acrylate copolymers in which some or all hydrogen atoms of hydroxyl or carboxyl groups are replaced by acid labile groups.

For ArF lithography resist materials, the preferred base resin has an aromatic-free structure. Illustrative polymers include (meth)acrylic derivative copolymers, norbornene derivative/maleic anhydride alternating copolymers, norbornene derivative/maleic anhydride/(meth)acrylic derivative copolymers, tetracyclododecene derivative/maleic anhydride alternating copolymers, tetracyclododecene derivative/maleic anhydride/(meth)acrylic derivative copolymers, norbornene derivative/maleimide derivative alternating copolymers, norbornene derivative/maleimide derivative/(meth)acrylic derivative copolymers, tetracyclododecene derivative/maleimide derivative alternating copolymers, tetracyclododecene derivative/maleimide derivative/(meth)acrylic derivative copolymers, polynorbornene derivatives, and ring-opening metathesis polymerization (ROMP) polymers, and a combination of any.

A polymer comprising recurring units containing aromatic ring could not be used initially as the ArF lithography resist since it has absorption at wavelength 193 nm. As the resist film becomes thinner, the influence of absorption is mitigated, indicating the potential of such a polymer being applied to the ArF lithography. Also, since the reflection of oblique incident light from the substrate increases when a projection lens has a NA in excess of 1, it is proposed to positively utilize the absorptive aromatic ring for suppressing reflection from the substrate. Polymers useful in this case include copolymers of hydroxyvinylnaphthalene, methacrylates containing naphthalene and naphthol structures on side chains, fluorinated hydroxystyrene, fluoroalkylhydroxystyrene, fluorinated styrene, fluoroalkylstyrene, hexafluoroisopropanolstyrene, and hexafluoroisopropanolindene.

A further aspect of the invention provides a pattern forming process involving the steps of forming a photoresist layer on a mask blank, forming a protective coating on the photoresist layer from the resist protective coating composition of the invention, effecting electron beam exposure in vacuum, and development.

Where the polymer is used as a resist protective coating for use with mask blanks, a photoresist is coated on a mask blank substrate of $SiO_2$, Cr, CrO, CrN, MoSi or the like before the protective coating composition is applied to form a protective coating on the resist film. By further forming a SOG film and an organic undercoat film between the photoresist and the blank substrate, there is provided a three-layer structure which is also acceptable herein. Once the protective coating film is formed, the structure is exposed to EB in vacuum using an EB image-writing system. The exposure is followed by post-exposure baking (PEB) and development in an alkaline developer for 10 to 300 seconds.

For the resist material used with mask blanks, novolac resins and hydroxystyrene are often used as the base resin. Those resins in which alkali-soluble hydroxyl groups are substituted by acid labile groups are used for positive resists while these resins in combination with crosslinking agents are used for negative resists. Base polymers which can be used herein include copolymers of hydroxystyrene with one or more of (meth)acrylic derivatives, styrene, vinyl naphthalene, vinyl anthracene, vinyl pyrene, hydroxyvinyl naphthalene, hydroxyvinyl anthracene, indene, hydroxyindene, acenaphthylene, norbornadiene, coumarone, and chromone.

EXAMPLE

Examples are given below by way of illustration and not by way of limitation. The abbreviations Mw and Mn are weight and number average molecular weights, respectively, as measured by gel permeation chromatography (GPC) using polystyrene standards, and Mw/Mn is a polydispersity index. Me stands for methyl, and PGMEA for propylene glycol monomethyl ether acetate.

Monomer Synthesis Example 1

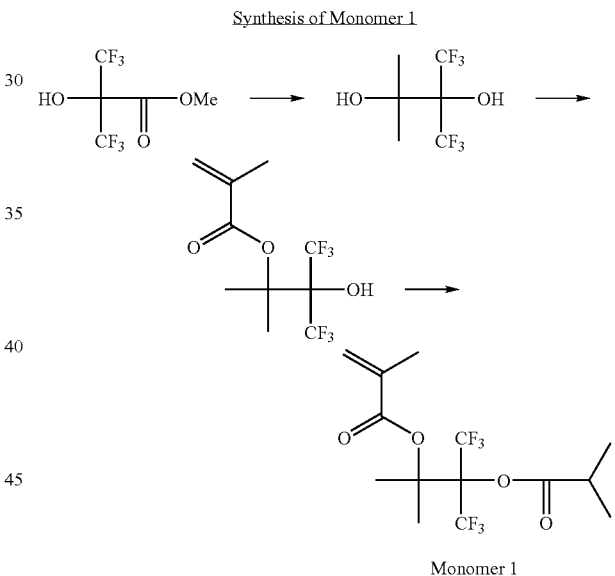

Monomer 1

Synthesis Example 1-1

Synthesis of 1,1,1-trifluoro-2-trifluoromethyl-3-methyl-2,3-butanediol

A flask was charged with 1,260 ml of 1M methylmagnesium chloride in tetrahydrofuran, to which 73.0 g of methyl 2-hydroxy-3,3,3-trifluoro-2-trifluoromethylpropionate was added dropwise below 50° C. The contents were stirred at room temperature for one hour, whereupon ammonium chloride aqueous solution was added for ordinary aqueous workup. Recrystallization from n-heptane gave 59.1 g (yield 81%) of the end compound.

Melting point: 48° C. (start at 36° C., ramp 1° C./min)
$^1$H-NMR (600 MHz in DMSO-$d_6$):
δ=1.31 (6H, s), 5.25 (1H, s), 7.43 (1H, s) ppm

Synthesis Example 1-2

Synthesis of 3-hydroxy-2-methyl-4,4,4-trifluoro-3-trifluoromethylbutan-2-yl methacrylate In 300 ml of toluene were dissolved 55.0 g of the alcohol obtained in Synthesis Example 1-1 and 32.0 g of triethylamine. The solution at 10° C. was combined with 26.7 g of methacrylic chloride and stirred at the temperature for 3 hours. 100 ml of water was added to the reaction solution below 30° C. for ordinary aqueous workup. Vacuum distillation gave 57.2 g (yield 80%) of the end compound.

Boiling point: 54-55° C./500 Pa

IR (thin film):

ν=3255, 3039, 3014, 2966, 2935, 1697, 1635, 1475, 1456, 1338, 1315, 1257, 1238, 1226, 1193, 1170, 1153, 1137, 987, 946, 904 cm$^{-1}$ $^1$H-NMR (600 MHz in DMSO-d$_6$):

δ=1.72 (6H, s), 1.81 (3H, s), 5.67 (1H, app t), 5.97 (1H, app t), 8.41 (1H, s) ppm $^{19}$F-NMR (565 MHz in DMSO-d$_6$, trifluoroacetic acid standard):

δ=−70.1 (6F, s) ppm

Synthesis Example 1-3

Synthesis of Monomer 1

In 300 ml of acetonitrile were dissolved 89.1 g of the methacrylate ester obtained in Synthesis Example 1-2 and 31.2 g of pyridine. The solution at 10° C. was combined with 40.3 g of isobutyric chloride and stirred at the temperature for 3 hours. 100 ml of water was added to the reaction solution below 30° C. for ordinary aqueous workup. Vacuum distillation gave 103 g (yield 94%) of the target compound.

Boiling point: 69-70° C./20 Pa

IR (thin film):

ν=2981, 2940, 2833, 1795, 1725, 1639, 1471, 1394, 1376, 1324, 1265, 1226, 1145, 1095, 1064, 1022, 985, 973 cm$^{-1}$ $^1$H-NMR (600 MHz in DMSO-d$_6$):

δ=1.14 (6H, d), 1.80 (6H, s), 1.83 (3H, s), 2.81 (1H, sept), 5.71 (1H, m), 5.97 (1H, s) ppm

Monomer Synthesis Example 2

Synthesis of Monomer 2

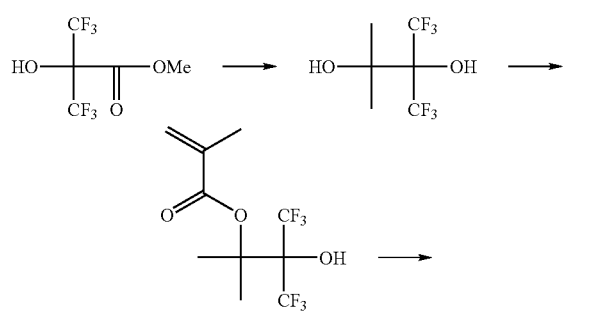

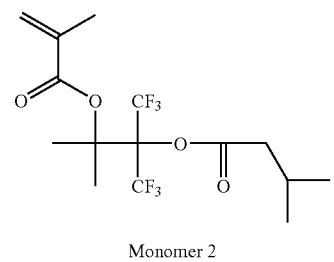

Monomer 2

In 300 ml of acetonitrile were dissolved 99.3 g of the methacrylate ester obtained in Synthesis Example 1-2 and 35.1 g of pyridine. The solution at 10° C. was combined with 49.7 g of isovaleric chloride and stirred at the temperature for 3 hours. 100 ml of water was added to the reaction solution below 30° C. for ordinary aqueous workup. Vacuum distillation gave 117 g (yield 97%) of the target compound.

Boiling point: 63-67° C./13 Pa

IR (thin film):

ν=3020, 2966, 2935, 2877, 1797, 1725, 1639, 1467, 1394, 1375, 1324, 1265, 1240, 1222, 1143, 1091, 1022, 983, 960 cm$^{-1}$ $^1$H-NMR (600 MHz in DMSO-d$_6$):

δ=0.92 (6H, d), 1.79 (6H, s), 1.82 (3H, s), 1.99 (1H, sept), 2.45 (2H, d), 5.70 (1H, app t), 5.97 (1H, s) ppm $^{19}$F-NMR (565 MHz in DMSO-d$_6$, trifluoroacetic acid standard):

δ=−64.8 (6F, s) ppm

Polymer Synthesis

Polymerizable monomers (Monomers 1 to 16) and an amine (Base 1) used in polymer synthesis are identified below by their structural formulae.

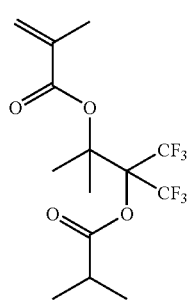

Monomer 1

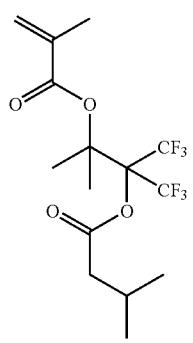

Monomer 2

Monomer 3
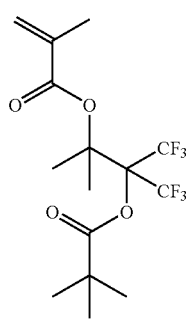
Monomer 4
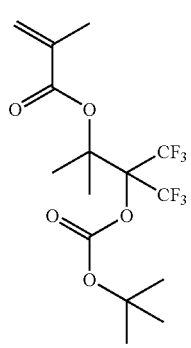
Monomer 5
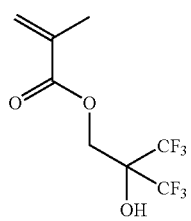
Monomer 6
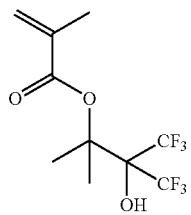
Monomer 7
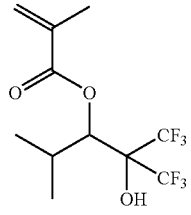
Monomer 8
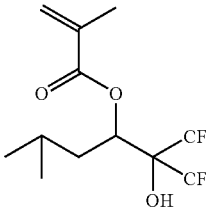
Monomer 9
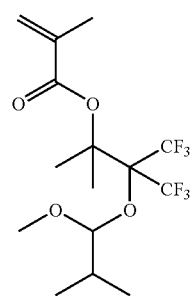
Monomer 10
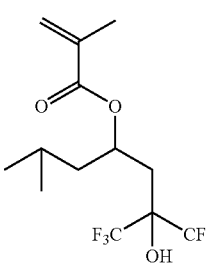
Monomer 11
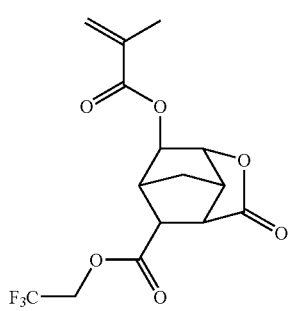
Monomer 12
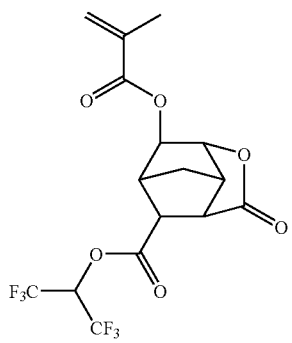
Monomer 13
Monomer 14
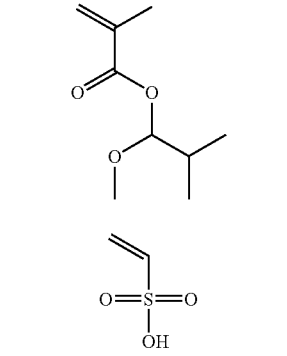

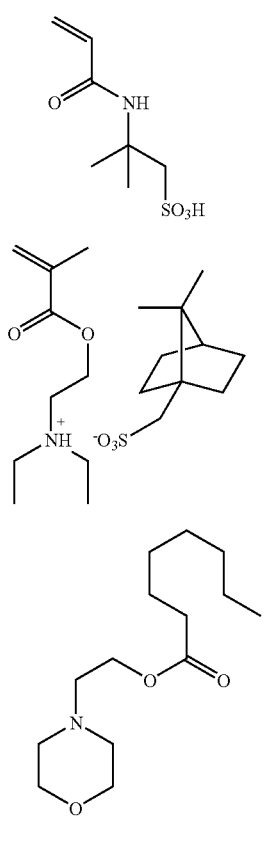

Monomer 15

Monomer 16

Base 1

Polymer Synthesis Example 1

Copolymerization of Monomers 1 and 6 (20/80)

In a nitrogen atmosphere, a flask was charged with 24.17 g of Monomer 1, 76.78 g of Monomer 6, 3.74 g of dimethyl 2,2'-azobis(isobutyrate), and 100.1 g of methyl ethyl ketone to form a monomer solution at a temperature of 20-25° C. In a nitrogen atmosphere, another flask was charged with 50.1 g of methyl ethyl ketone, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. To the flask 200 g of toluene was admitted. Using an evaporator, the reaction mixture was concentrated until the total weight reached 250 g. The concentrate was added dropwise to 1,500 g of hexane. The copolymer thus precipitated was separated and washed with 600 g of hexane, obtaining a white solid. The solid was vacuum dried at 50° C. for 20 hours, yielding 71.3 g of the target polymer, designated Polymer 2. On $^1$H-NMR analysis of resin composition, the copolymer consisted of Monomers 1 and 6 in a ratio of 19/81 mol %.

Polymer Synthesis Examples 2 to 19

Like Polymer 2, Polymers 1 to 19 were synthesized using the polymerizable monomers (Monomers 1 to 13) in accordance with the formulation shown in Tables 1 to 5.

TABLE 1

| | Monomer | | | | | Yield | | |
|---|---|---|---|---|---|---|---|---|
| | 1 | 5 | 6 | 7 | 8 | (%) | Mw | Mw/Mn |
| Polymer 1 | 20 | 80 | | | | 70.2 | 7,200 | 1.4 |
| Polymer 2 | 20 | | 80 | | | 71.3 | 7,500 | 1.4 |
| Polymer 3 | 20 | | | 80 | | 72.2 | 7,100 | 1.4 |
| Polymer 4 | 20 | | | | 80 | 69.5 | 7,200 | 1.4 |

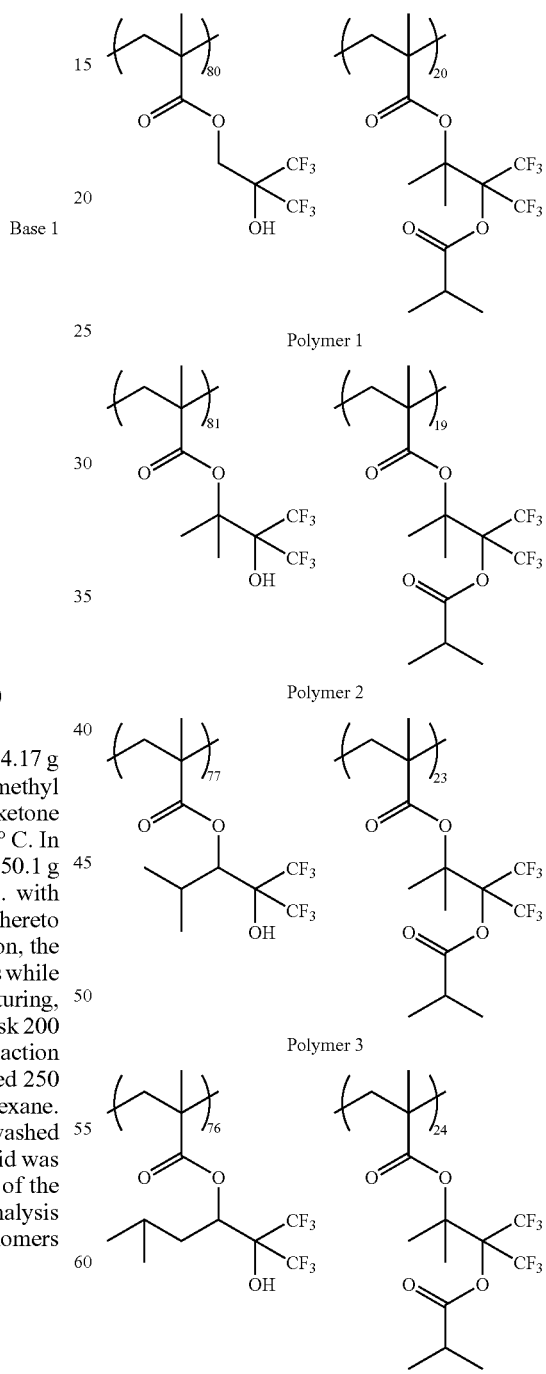

Polymer 1

Polymer 2

Polymer 3

Polymer 4

TABLE 2
| | Monomer | | | | Yield | | |
|---|---|---|---|---|---|---|---|
| | 2 | 3 | 4 | 6 | (%) | Mw | Mw/Mn |
| Polymer 5 | 20 | | | 80 | 69.2 | 7,300 | 1.4 |
| Polymer 6 | | 20 | | 80 | 71.2 | 7,100 | 1.4 |
| Polymer 7 | | | 20 | 80 | 70.5 | 7,100 | 1.4 |
TABLE 3
| | Monomer | | | | | Yield | | |
|---|---|---|---|---|---|---|---|---|
| | 1 | 5 | 6 | 7 | 8 | (%) | Mw | Mw/Mn |
| Polymer 8 | 40 | 60 | | | | 70.2 | 7,200 | 1.4 |
| Polymer 9 | 40 | | 60 | | | 71.3 | 7,500 | 1.4 |
| Polymer 10 | 40 | | | 60 | | 72.2 | 7,100 | 1.4 |
| Polymer 11 | 40 | | | | 60 | 69.5 | 7,200 | 1.4 |
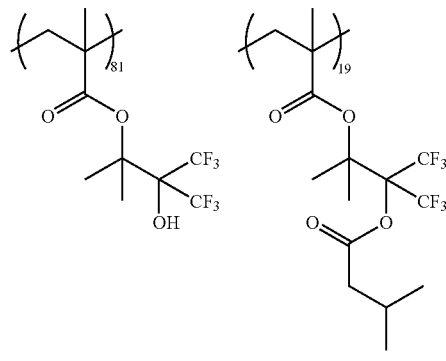
Polymer 5
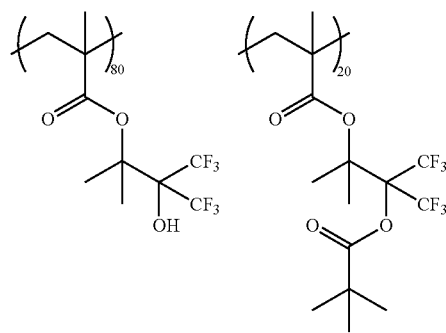
Polymer 6
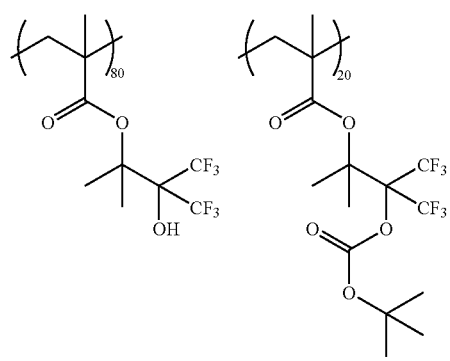
Polymer 7
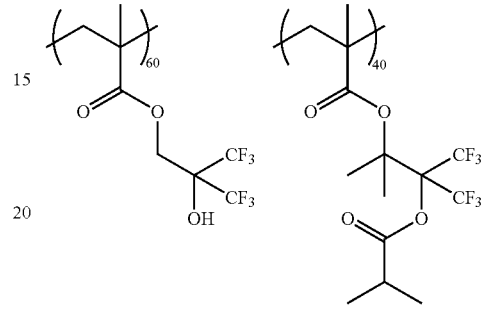
Polymer 8
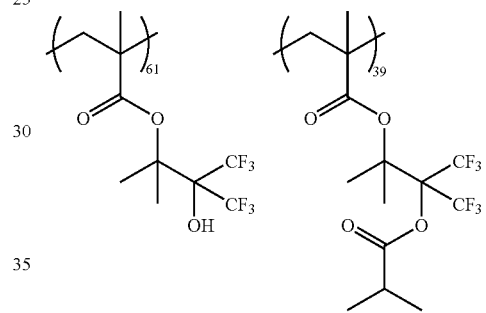
Polymer 9
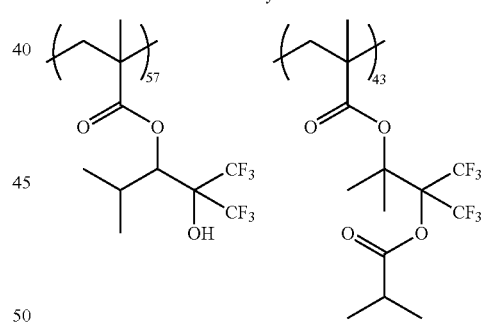
Polymer 10
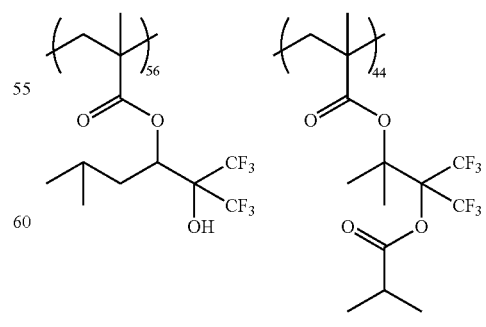
Polymer 11

TABLE 4
| | Monomer | | | | Yield | | |
| --- | --- | --- | --- | --- | --- | --- | --- |
| | 2 | 3 | 4 | 6 | (%) | Mw | Mw/Mn |
| Polymer 12 | 40 | | | 60 | 69.4 | 7,000 | 1.4 |
| Polymer 13 | | 40 | | 60 | 72.5 | 7,400 | 1.4 |
| Polymer 14 | | | 40 | 60 | 71.5 | 7,000 | 1.4 |
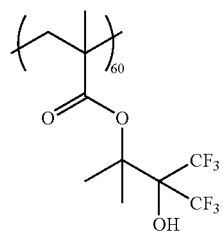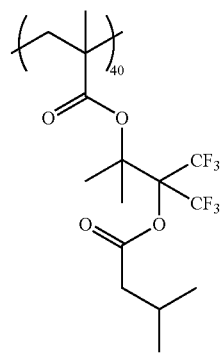
Polymer 12
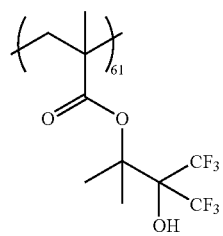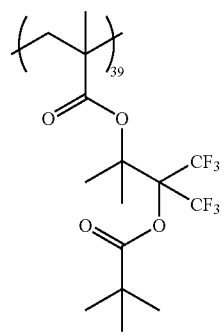
Polymer 13
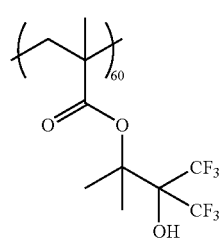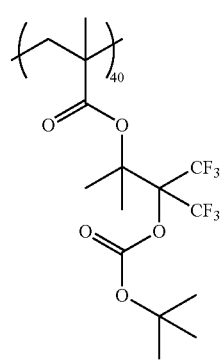
Polymer 14
TABLE 5
| | Monomer | | | | | | | Yield (%) | Mw | Mw/Mn |
| --- | --- | --- | --- | --- | --- | --- | --- | --- | --- | --- |
| | 1 | 6 | 9 | 10 | 11 | 12 | 13 | | | |
| Polymer 15 | 20 | 70 | 10 | | | | | 69.9 | 7,000 | 1.4 |
| Polymer 16 | 20 | 70 | | 10 | | | | 70.5 | 7,200 | 1.4 |
| Polymer 17 | 20 | 70 | | | 10 | | | 72.2 | 7,100 | 1.4 |
| Polymer 18 | 20 | 70 | | | | 10 | | 74.1 | 7,200 | 1.4 |
| Polymer 19 | 20 | 70 | | | | | 10 | 70.5 | 7,000 | 1.4 |
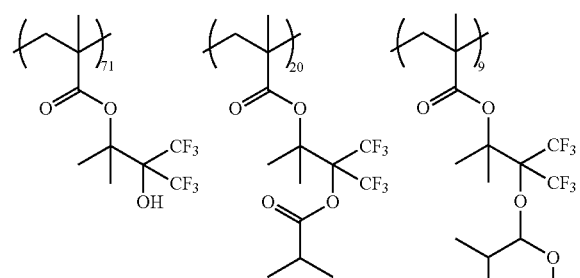
Polymer 15
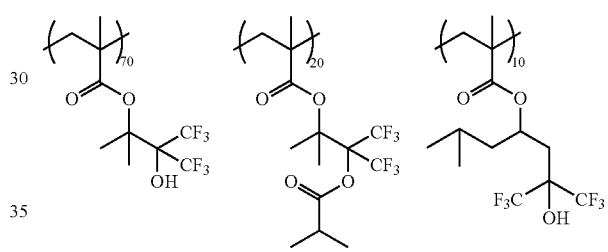
Polymer 16
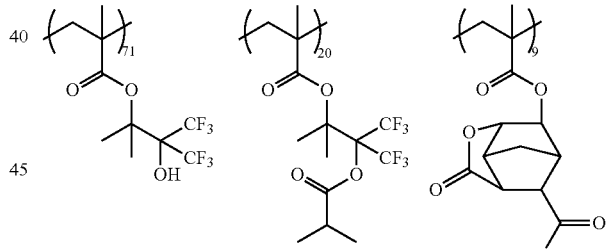
Polymer 17
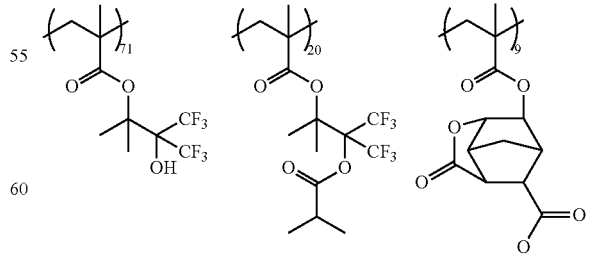
Polymer 18

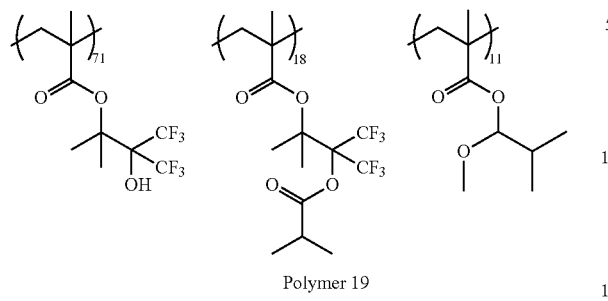

Polymer 19

Polymer Synthesis Example 20

Copolymerization of Monomers 6 and 14 (90/10) in the Presence of Base 1

In a nitrogen atmosphere, a flask was charged with 96.46 g of Monomer 6, 4.03 g of Monomer 14, 1.87 g of Base 1, 4.18 g of dimethyl 2,2'-azobis(isobutyrate), and 155.56 g of isopropyl alcohol to form a monomer solution at a temperature of 20-25° C. In a nitrogen atmosphere, another flask was charged with 77.78 g of isopropyl alcohol, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. After 300 g of 2-propanol was added, the polymerization solution was washed three times with 300 g of ultrapure water. The organic layer extracted was concentrated on an evaporator until the total weight reached 200 g. The concentrate was crystallized in 1,500 g of hexane. The copolymer thus precipitated was separated and washed with 600 g of hexane, obtaining a white solid. The solid was vacuum dried at 50° C. for 20 hours, yielding 79.8 g of the target polymer, designated Polymer 20. On $^1$H-NMR analysis of resin composition, the copolymer consisted of Monomer 6, Monomer 14 and Base 1 salt in a ratio of 89/9/2 mol % as shown below.

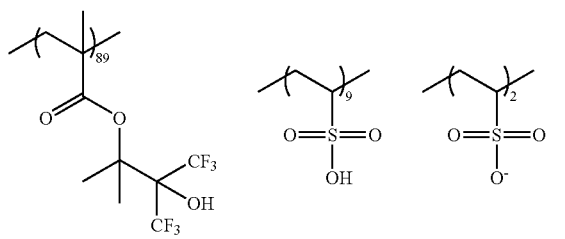

Polymer 20

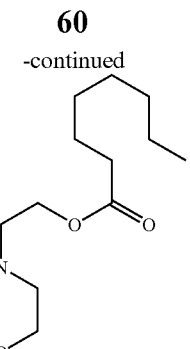

Polymer Synthesis Example 21

Copolymerization of Monomers 6 and 15 (90/10) in the Presence of Base 1

By the same procedure as in the synthesis of Polymer 20, aside from using Monomer 6, Monomer 15 and Base 1, 75.3 g of the target polymer (Polymer 21) was synthesized. On $^1$H-NMR analysis of resin composition, the copolymer consisted of Monomer 6, Monomer 15 and Base 1 salt in a ratio of 90/8/2 mol % as shown below.

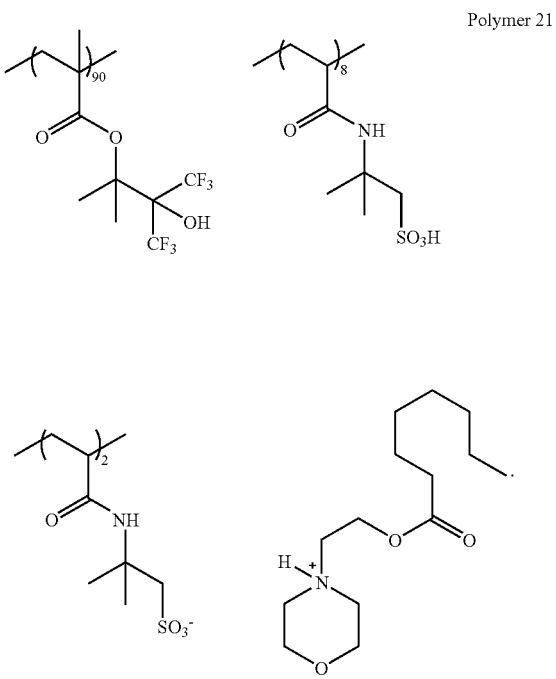

Polymer 21

Polymer Synthesis Example 22

Copolymerization of Monomers 6 and 16 (90/10)

By the same procedure as in the synthesis of Polymer 20, aside from using Monomers 6 and 16, 81.5 g of the target polymer (Polymer 22) was synthesized. On $^1$H-NMR analysis of resin composition, the copolymer consisted of Monomers 6 and 16 in a ratio of 90/10 mol % as shown below.

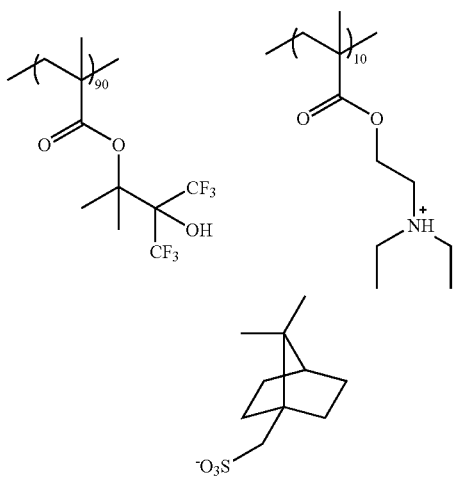

Polymer 22

Comparative Polymer Synthesis Example 1

Synthesis of Homopolymer of Monomer 6

In a nitrogen atmosphere, a flask was charged with 100.0 g of Monomer 6, 3.91 g of dimethyl 2,2'-azobis-(isobutyrate), and 100.0 g of isopropyl alcohol to form a monomer solution at a temperature of 20-25° C. In a nitrogen atmosphere, another flask was charged with 50.0 g of isopropyl alcohol, which was heated at 80° C. with stirring. The monomer solution was added dropwise thereto over 4 hours. After the completion of dropwise addition, the polymerization solution was stirred for a further 3 hours while maintaining the temperature of 80° C. At the end of maturing, the solution was cooled to room temperature. The polymerization solution was added dropwise to 2,000 g of water. The polymer thus precipitated was filtered and washed four times with 600 g of a 9/1 hexane/isopropyl ether mixture, obtaining a white solid. The solid was vacuum dried at 50° C. for 20 hours, yielding 92.8 g of the target polymer, designated Comparative Polymer 1. On GPC analysis, the polymer had Mw of 7,800 and Mw/Mn of 1.6.

Evaluation of Protective Coating

Resist protective topcoat solutions TC-1 to 28 and Comparative-TC-1 to 2 were prepared by dissolving 1.0 g of each of Inventive Polymers 1 to 22 and Comparative Polymer 1 in a solvent mixture of 23 g of diisopentyl ether and 2 g of 2-methyl-1-butanol in accordance with the formulation of Table 6 and filtering through a polypropylene filter with a pore size of 0.2 μm.

The resist protective topcoat solutions were spin coated onto silicon substrates and baked at 100° C. for 60 seconds to form protective films TC-1 to 28 and Comparative-TC-1 to 2 of 50 nm thick. The wafers coated with protective films were tested for the following properties: (1) a refractive index at wavelength 193 nm using a spectroscopic ellipsometer of J. A. Woollam Co., (2) a film thickness change after rinsing with pure water for 5 minutes, (3) a film thickness change after development with 2.38 wt % tetramethylammonium hydroxide (TMAH) aqueous solution, and (4) a sliding angle and a receding contact angle using an inclination contact angle meter Drop Master 500 (Kyowa Interface Science Co., Ltd.). The results are shown in Table 6.

TABLE 6

| Resist protective topcoat | Polymers in protective topcoat (mix ratio) | Refractive index @193 nm | Film thickness change after water rinsing (nm) | Film thickness after development (nm) | Sliding angle (°) | Receding contact angle (°) |
|---|---|---|---|---|---|---|
| TC-1 | Polymer 1(100) | 1.54 | 0 | 0 | 13 | 67 |
| TC-2 | Polymer 2(100) | 1.54 | 0 | 0 | 11 | 75 |
| TC-3 | Polymer 3(100) | 1.54 | 0 | 0 | 11 | 75 |
| TC-4 | Polymer 4(100) | 1.54 | 0 | 0 | 10 | 76 |
| TC-5 | Polymer 5(100) | 1.54 | 0 | 0 | 11 | 74 |
| TC-6 | Polymer 6(100) | 1.54 | 0 | 0 | 11 | 74 |
| TC-7 | Polymer 7(100) | 1.54 | 0 | 0 | 12 | 73 |
| TC-8 | Polymer 8(100) | 1.54 | 0 | 0 | 13 | 70 |
| TC-9 | Polymer 9(100) | 1.54 | 0 | 0 | 10 | 79 |
| TC-10 | Polymer 10(100) | 1.54 | 0 | 0 | 10 | 79 |
| TC-11 | Polymer 11(100) | 1.54 | 0 | 0 | 9 | 80 |
| TC-12 | Polymer 12(100) | 1.54 | 0 | 0 | 10 | 78 |
| TC-13 | Polymer 13(100) | 1.54 | 0 | 0 | 10 | 78 |
| TC-14 | Polymer 14(100) | 1.54 | 0 | 0 | 10 | 77 |
| TC-15 | Polymer 15(100) | 1.54 | 0 | 0 | 10 | 76 |
| TC-16 | Polymer 16(100) | 1.54 | 0 | 0 | 10 | 77 |
| TC-17 | Polymer 17(100) | 1.54 | 0 | 0 | 12 | 73 |
| TC-18 | Polymer 18(100) | 1.54 | 0 | 0 | 12 | 74 |
| TC-19 | Polymer 19(100) | 1.54 | 0 | 0 | 11 | 75 |
| TC-20 | Polymer 8(75) Polymer 20(25) | 1.54 | 0 | 0 | 12 | 69 |
| TC-21 | Polymer 9(75) Polymer 20(25) | 1.54 | 0 | 0 | 9 | 78 |
| TC-22 | Polymer 10(75) Polymer 20(25) | 1.54 | 0 | 0 | 9 | 78 |
| TC-23 | Polymer 11(75) Polymer 20(25) | 1.54 | 0 | 0 | 9 | 79 |
| TC-24 | Polymer 12(75) Polymer 20(25) | 1.54 | 0 | 0 | 9 | 77 |
| TC-25 | Polymer 13(75) Polymer 20(25) | 1.54 | 0 | 0 | 9 | 77 |

TABLE 6-continued

| Resist protective topcoat | Polymers in protective topcoat (mix ratio) | Refractive index @193 nm | Film thickness change after water rinsing (nm) | Film thickness after development (nm) | Sliding angle (°) | Receding contact angle (°) |
|---|---|---|---|---|---|---|
| TC-26 | Polymer 14(75) Polymer 20(25) | 1.54 | 0 | 0 | 9 | 77 |
| TC-27 | Polymer 9(75) Polymer 21(25) | 1.54 | 0 | 0 | 9 | 80 |
| TC-28 | Polymer 9(75) Polymer 22(25) | 1.54 | 0 | 0 | 9 | 81 |
| Comparative TC-1 | Comparative Polymer 1(100) | 1.54 | 0 | 0 | 15 | 69 |
| Comparative TC-2 | Comparative Polymer 1(75) Polymer 20(25) | 1.54 | 0 | 0 | 15 | 68 |

As seen from Table 6, the inventive polymers P1 have a greater receding contact angle than the comparative polymer. The value of receding contact angle differs little between a P1/P2 polymer blend and polymer P1 alone, demonstrating effective layer separation between polymers P1 and P2, that is, a layer of polymer P1 is disposed on top of a layer of polymer P2. In general, a smaller sliding angle indicates an easier flow of water on the protective coating; and a larger receding contact angle indicates that fewer liquid droplets are left during high-speed scan exposure. It is seen from Table 6 that the protective topcoats TC-1 to 28 within the scope of the invention are improved in sliding angle and receding contact angle over Comparative TC-1 to 2.

Evaluation of Resist

A resist solution was prepared by dissolving 5 g of Resist Polymer, 0.5 g of a photoacid generator PAG1, and 0.1 g of Quencher 1 (all shown below) in 100 g of PGMEA and filtering through a polypropylene filter having a pore size of 0.2 μm.

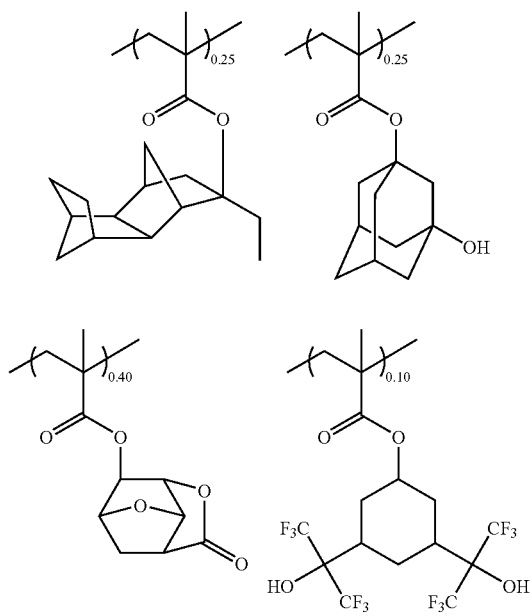

Resist Polymer: Mw = 7,600; Mw/Mn = 1.8

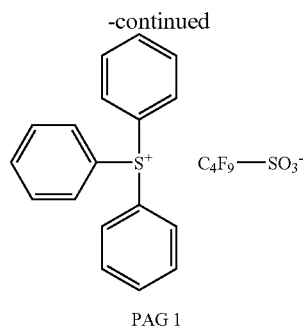

PAG 1

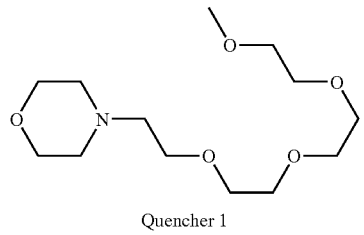

Quencher 1

An antireflective coating ARC-29A (Nissan Chemical Co., Ltd.) was deposited on a silicon substrate to a thickness of 87 nm. The resist solution was applied onto the ARC and baked at 105° C. for 60 seconds to form a resist film of 120 nm thick. The protective topcoat solution (prepared above) was applied onto the resist film and baked at 100° C. for 60 seconds. In order to simulate immersion lithography, light exposure was preceded by rinsing of the coating with pure water for 5 minutes. The structure was exposed by means of an ArF scanner model S307E (Nikon Corp., NA 0.85, a 0.93/0.62, 20° dipole illumination, 6% halftone phase shift mask), rinsed for 5 minutes while splashing pure water, post-exposure baked (PEB) at 100° C. for 60 seconds, and developed with a 2.38 wt % TMAH aqueous solution for 60 seconds. As a comparative run, a similar process including light exposure, water rinsing, PEB and development was carried out in the absence of the protective coating. The wafers were sectioned for comparing the profile of 65-nm line-and-space pattern and sensitivity. Further, 5 μl of water droplet was dropped on the resist film after development, and a contact angle at the interface between the resist and water droplet was measured. The results are shown in Table 7.

TABLE 7

| Resist protective topcoat | Sensitivity (mJ/cm²) | 65-nm pattern profile | Contact angle with water after development (°) |
|---|---|---|---|
| TC-20 | 30 | rectangular | 60 |
| TC-21 | 29 | rectangular | 59 |
| TC-22 | 29 | rectangular | 60 |
| TC-23 | 30 | rectangular | 61 |
| TC-24 | 30 | rectangular | 61 |
| TC-25 | 29 | rectangular | 61 |
| TC-26 | 30 | rectangular | 60 |
| TC-27 | 30 | rectangular | 60 |
| TC-28 | 30 | rectangular | 60 |
| Comparative TC-1 | 28 | rounded top | 68 |
| Comparative TC-2 | 29 | rounded top | 70 |
| no protective film | 30 | T-top | 62 |

When water rinsing was carried out after exposure in the absence of a protective topcoat, the resist pattern had a T-top profile. This is presumably because the acid generated was dissolved in water. In the presence of a protective topcoat according to the invention which had a large receding contact angle, the resist film had a reduced contact angle after development and produced a resist pattern of rectangular profile after development.

A protective topcoat of polymer P1 alone has a large receding contact angle, but provides a large contact angle with water after development. In contrast, a film of polymer P2 having a sulfonic acid amine salt is inferior in water repellency and water slip, but provides a small contact angle with water after development and a resist pattern of rectangular profile. A blend of polymer P1 with polymer P2 forms a protective topcoat which has a large receding contact angle and provides a small contact angle with water after development.

In a further run, some resist protective topcoat solutions (TC-21 and Comparative TC-2) used in the exposure experiment were precision filtered through a high-density polyethylene filter with a pore size of 0.02 µm. An antireflective coating ARC-29A (Nissan Chemical Co., Ltd.) of 87 nm thick was deposited on a 8-inch silicon substrate. The resist solution was applied onto the ARC and baked at 105° C. for 60 seconds to form a resist film of 120 nm thick. Each protective topcoat solution was coated thereon and baked at 100° C. for 60 seconds. Using an ArF scanner model S307E (Nikon Corp., NA 0.85, σ 0.93, Cr mask), the entire surface of the wafer was subjected to checkered-flag exposure including alternate exposure of open-frame exposed and unexposed portions having an area of 20 mm square. This was followed by post-exposure baking (PEB) and development with a 2.38 wt % TMAH aqueous solution for 60 seconds.

Using a flaw detector Win-Win 50-1200 (Tokyo Seimitsu Co., Ltd.), the number of defects in the unexposed portion of the checkered-flag was counted at the pixel size of 0.125 µm. Those defects on the resist surface in the unexposed portion are stain-like defects and classified as blob defects. The results are shown in Table 8. It is evident that the protective topcoat compositions comprising a blend of polymers P1 and P2 produce a dramatically reduced number of defects, as compared with the comparative protective topcoat composition.

TABLE 8

| Resist protective topcoat | Number of defects |
|---|---|
| TC-21 | 16 |
| Comparative TC-2 | 3,000 |

EB Lithography

In an EB image writing test, a positive resist material was prepared by dissolving 90 parts by weight of EB Polymer synthesized by radical polymerization, 10 parts by weight of PAG2, and 0.4 part by weight of Quencher 2 (all shown below) in 700 parts by weight of PGMEA and 300 parts by weight of ethyl lactate (EL) and filtering through a filter with a pore size of 0.2 µm.

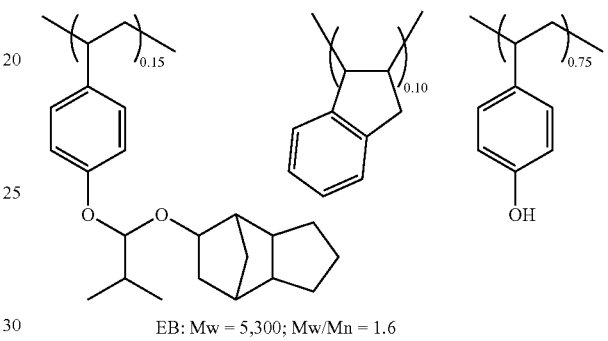

EB: Mw = 5,300; Mw/Mn = 1.6

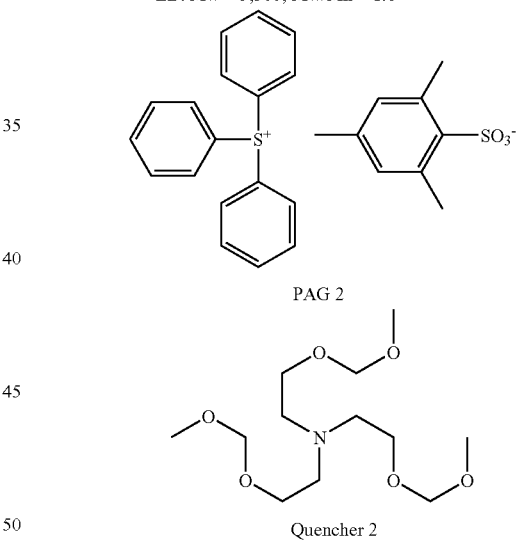

PAG 2

Quencher 2

Using Clean Track Mark 5 (Tokyo Electron Ltd.), the positive resist material was spin coated on a silicon substrate with a diameter of 6 inches (150 mm) and prebaked on a hot plate at 110° C. for 60 seconds to form a resist film of 200 nm thick. A protective coating was coated thereon. Using HL-800D (Hitachi, Ltd.) at a HV voltage of 50 keV, imagewise exposure was performed on the wafer in a vacuum chamber. The wafer was then allowed to stand in the vacuum chamber for 20 hours, after which additional imagewise exposure was performed at a different area.

Using Clean Track Mark 5 (Tokyo Electron Ltd.), immediately after the imagewise exposure, the wafer was post-exposure baked (PEB) on a hot plate at 90° C. for 60 seconds and puddle developed in a 2.38 wt % TMAH aqueous solution for 30 seconds to form a positive pattern.

Using a measurement SEM S-7280 (Hitachi, Ltd.), a size change during the vacuum holding duration was determined. After an exposure dose which provided a 1:1 resolution at the top and bottom of a 0.12 μm line-and-space pattern was determined, a 0.12 μm line-and-space pattern at that exposure dose was measured for line width in both the initially exposed area and the 20 hour later exposed area. A difference therebetween is the size change. Positive values of size change indicate that the resist sensitivity varies toward a higher level during vacuum holding whereas negative values indicate that the sensitivity varies toward a lower level. The results are shown in Table 9.

TABLE 9

| Resist protective topcoat | Size change (nm) |
| --- | --- |
| TC-20 | 0 |
| TC-21 | −1 |
| TC-22 | 0 |
| TC-23 | 0 |
| TC-24 | −1 |
| TC-25 | −1 |
| TC-26 | 0 |
| TC-27 | 0 |
| TC-28 | 0 |
| no protective film | −9 |

In the EB imagewise exposure test, the application of inventive resist protective topcoats (TC-20 to 28) improved the stability of resist during post-exposure vacuum holding.

While various embodiments of the present invention have been shown and described herein, it will be understood that such embodiments are provided by way of example only and not of limitation. Numerous variations, changes and substitutions will occur to those skilled in the art without departing from the teaching of the present invention. Accordingly, it is intended that the invention be interpreted within the full spirit and scope of the appended claims.

Japanese Patent Application No. 2008-307188 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of (1) applying a resist material onto a substrate to form a photoresist film, (2) applying a resist protective coating composition onto the photoresist film to form a protective coating thereon, (3) heat treating and exposing the coated substrate to high-energy radiation from a projection lens through a photomask while holding a liquid between the substrate and the projection lens, and (4) developing with a developer, said resist protective coating composition comprising a polymer P1 comprising recurring units of the general formula (1):

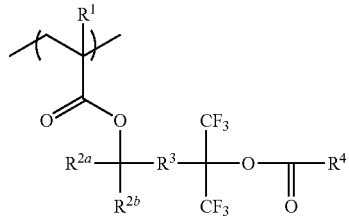

(1)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^3$ is a single bond or straight, branched or cyclic $C_1$-$C_{15}$ alkylene, and $R^4$ is a straight, branched or cyclic $C_1$-$C_{20}$ alkyl or fluoroalkyl.

2. The process of claim 1 wherein the liquid is water.

3. The process of claim 1 wherein the high-energy radiation has a wavelength in the range of 180 to 250 nm.

4. The process of claim 1 wherein the developing step uses a liquid alkaline developer for thereby developing the photoresist film to form a resist pattern and stripping the resist protective coating therefrom at the same time.

5. The pattern forming process of claim 1, wherein said polymer P1 further comprises recurring units of at least one type selected from the general formulae (2a), (2b), (2c), (2e) and (2f):

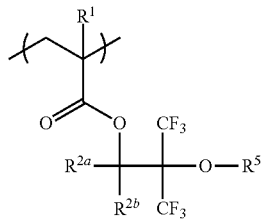

(2a)

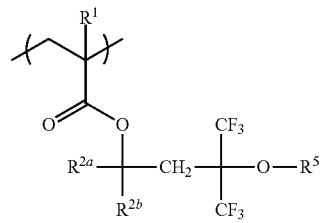

(2b)

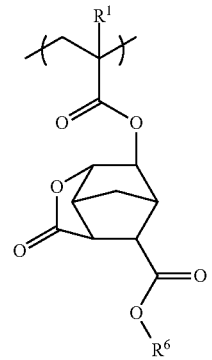

(2c)

(2e)

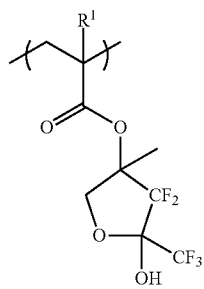

(2f)

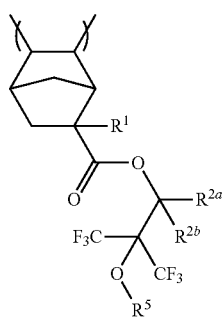

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^5$ is hydrogen, or a straight, branched or cyclic $C_1$-$C_{15}$ alkyl or fluoroalkyl, or an acid labile group, and $R^6$ is a straight, branched or cyclic $C_1$-$C_{15}$ fluoroalkyl.

6. The pattern forming process of claim 1, wherein the protective coating composition further comprises a polymer P2 comprising recurring units of the general formula (3) or (4):

(P2)

(3)

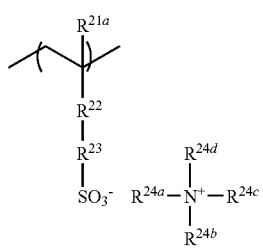

(4)

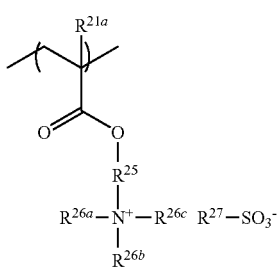

wherein:
$R^{21a}$ and $R^{21b}$ are hydrogen or methyl,
$R^{22}$ is a single bond, $C_1$-$C_4$ alkylene, phenylene, —C(=O)—, or —C(=O)—NH—, $R^{23}$ is a single bond or straight, branched or cyclic $C_1$-$C_8$ alkylene, $R^{24a}$ to $R^{24d}$ and $R^{26a}$ to $R^{26c}$ are each independently selected from the group consisting of hydrogen, straight, branched or cyclic $C_1$-$C_{12}$ alkyl, alkenyl, oxoalkyl and oxoalkenyl, $C_6$-$C_{20}$ aryl, $C_7$-$C_{12}$ aralkyl and aryloxoalkyl, in which some or all hydrogen atoms may be substituted by alkoxy groups, $R^{24a}$ to $R^{24d}$ and $R^{26a}$ to $R^{26c}$ may contain a nitrogen atom, ether, ester, hydroxyl or carboxyl group, any two of $R^{24a}$ to $R^{24d}$ and any two of $R^{26a}$ to $R^{26c}$ may bond together to form a ring with the nitrogen atom to which they are attached, in this event, each participant in the ring formation independently denotes a $C_3$-$C_{15}$ alkylene or a hetero-aromatic ring containing the nitrogen atom therein, $R^{25}$ is straight, branched or cyclic $C_1$-$C_8$ alkylene, and $R^{27}$ is a straight, branched or cyclic $C_1$-$C_{20}$ alkyl which may have a carbonyl, ester, ether group or halogen atom, or a $C_6$-$C_{15}$ aryl which may have a carbonyl, ester, ether, halogen atom, or $C_1$-$C_{15}$ alkyl or fluoroalkyl.

7. The pattern forming process of claim 6, wherein said polymer P2 further comprises recurring units of the general formula (5):

(5)

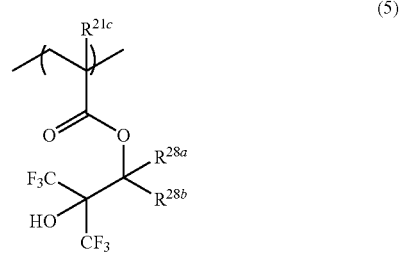

wherein $R^{21c}$ is hydrogen or methyl, $R^{28a}$ and $R^{28b}$ are hydrogen or straight, branched or cyclic $C_1$-$C_{15}$ alkyl, and $R^{28a}$ and $R^{28b}$ may bond together to form a ring with the carbon atom to which they are attached.

8. The pattern forming process of claim 1, wherein the protective coating composition further comprises a solvent.

9. The pattern forming process of claim 8, wherein the solvent comprises an ether compound of 8 to 12 carbon atoms.

10. The pattern forming process of claim 9, wherein the solvent comprises at least one ether compound of 8 to 12 carbon atoms selected from the group consisting of di-n-butyl ether, diisobutyl ether, di-sec-butyl ether, di-n-pentyl ether, diisopentyl ether, di-sec-pentyl ether, di-t-amyl ether, and di-n-hexyl ether.

11. The pattern forming process of claim 8, wherein the solvent comprises a mixture of an ether compound and 0.1 to 90% by weight of a higher alcohol of 4 to 10 carbon atoms.

12. A lithography process for forming a pattern, comprising the steps of forming a protective coating on a photoresist layer disposed on a mask blank, exposing the layer structure in vacuum to electron beam, and developing, the protective coating being formed of a protective coating composition comprising a polymer P1 comprising recurring units of the general formula (1):

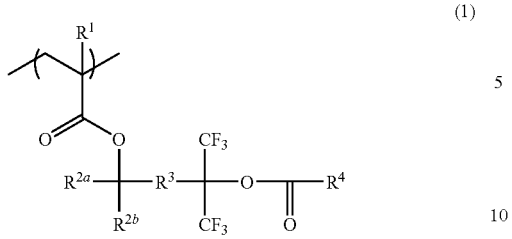
(1)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^3$ is a single bond or straight, branched or cyclic $C_1$-$C_{15}$ alkylene, and $R^4$ is a straight, branched or cyclic $C_1$-$C_{20}$ alkyl or fluoroalkyl.

13. The lithography process of claim 12, wherein said polymer P1 further comprises recurring units of at least one type selected from the general formulae (2a), (2b), (2c), (2e) and (20f):

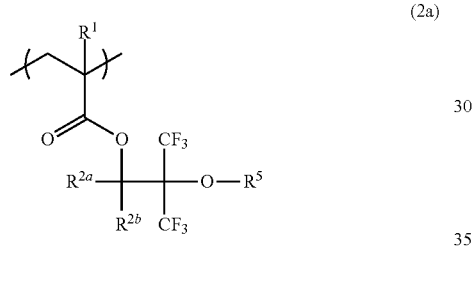
(2a)

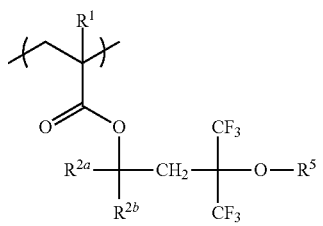
(2b)

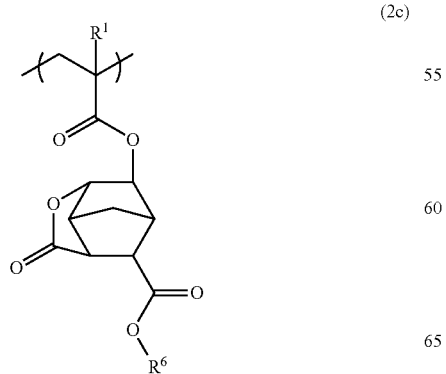
(2c)

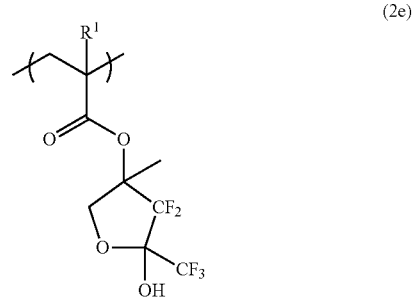
(2e)

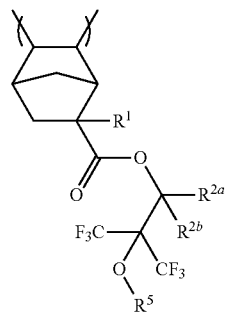
(2f)

wherein $R^1$ is hydrogen, methyl or trifluoromethyl, $R^{2a}$ and $R^{2b}$ are hydrogen or straight, branched or cyclic $C_1$-$C_{15}$ alkyl, $R^{2a}$ and $R^{2b}$ may bond together to form a ring with the carbon atom to which they are attached, $R^5$ is hydrogen, or a straight, branched or cyclic $C_1$-$C_{15}$ alkyl or fluoroalkyl, or an acid labile group, $R^6$ is a straight, branched or cyclic $C_1$-$C_{15}$ fluoroalkyl.

14. The lithography process of claim 12, wherein the protective coating composition further comprises a polymer P2 comprising recurring units of the general formula (3) or (4):

(P2)

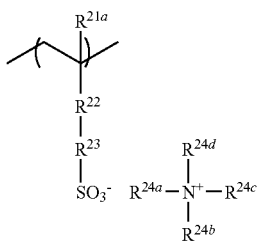
(3)

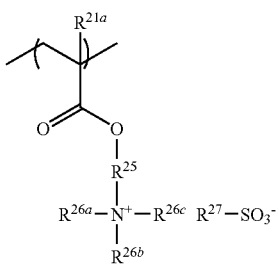

(4)

wherein:
R$^{21a}$ and R$^{21b}$ are hydrogen or methyl,
R$^{22}$ is a single bond, C$_1$-C$_4$ alkylene, phenylene, or —C(=O)—, or —C(=O)—NH—,
R$^{23}$ is a single bond or straight, branched or cyclic C$_1$-C$_8$ alkylene,
R$^{24a}$ to R$^{24d}$ and R$^{26a}$ to R$^{26c}$ are each independently selected from the group consisting of hydrogen, straight, branched or cyclic C$_1$-C$_{12}$ alkyl, alkenyl, oxoalkyl and oxoalkenyl, C$_6$-C$_{20}$ aryl, C$_7$-C$_{12}$ aralkyl and aryloxoalkyl, in which some or all hydrogen atoms may be substituted by alkoxy groups, R$^{24a}$ to R$^{24d}$ and R$^{26a}$ to R$^{26c}$ may contain a nitrogen atom, ether, ester, hydroxyl or carboxyl group, any two of R$^{24a}$ to R$^{24d}$ and any two of R$^{26a}$ to R$^{26c}$ may bond together to form a ring with the nitrogen atom to which they are attached, in this event, each participant in the ring formation independently denotes a C$_3$-C$_{15}$ alkylene or a hetero-aromatic ring containing the nitrogen atom therein,
R$^{25}$ is straight, branched or cyclic C$_1$-C$_8$ alkylene, and
R$^{27}$ is a straight, branched or cyclic C$_1$-C$_{20}$ alkyl which may have a carbonyl, ester, ether group or halogen atom, or a C$_6$-C$_{15}$ aryl which may have a carbonyl, ester, ether, halogen atom, or C$_1$-C$_{15}$ alkyl or fluoroalkyl.

15. The lithography process of claim 14, wherein said polymer P2 further comprises recurring units of the general formula (5):

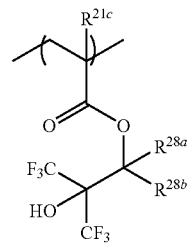

(5)

wherein R$^{21c}$ is hydrogen or methyl, R$^{28a}$ and R$^{28b}$ are hydrogen or straight, branched or cyclic C$_1$-C$_{15}$ alkyl, and R$^{28a}$ and R$^{28b}$ may bond together to form a ring with the carbon atom to which they are attached.

16. The lithography process of claim 12, wherein the protective coating composition further comprises a solvent.

17. The lithography process of claim 16, wherein the solvent comprises an ether compound of 8 to 12 carbon atoms.

18. The lithography process of claim 17, wherein the solvent comprises at least one ether compound of 8 to 12 carbon atoms selected from the group consisting of di-n-butyl ether, diisobutyl ether, di-sec-butyl ether, di-n-pentyl ether, diisopentyl ether, di-sec-pentyl ether, di-t-amyl ether, and di-n-hexyl ether.

19. The lithography process of claim 16, wherein the solvent comprises a mixture of an ether compound and 0.1 to 90% by weight of a higher alcohol of 4 to 10 carbon atoms.

* * * * *